United States Patent
Ji et al.

(10) Patent No.: US 11,456,302 B2
(45) Date of Patent: Sep. 27, 2022

(54) SEMICONDUCTOR DEVICE HAVING LOW-K SPACER AND CONVERTING SPACER AND METHOD FOR FABRICATING THE SAME

(71) Applicant: SK hynix Inc., Gyeonggi-do (KR)

(72) Inventors: Yun-Hyuck Ji, Seoul (KR); Beom-Ho Mun, Gyeonggi-do (KR); In-Sang Kim, Gyeongsangnam-do (KR)

(73) Assignee: SK hynix Inc., Gyeonggi-do (KR)

( * ) Notice: Subject to any disclaimer, the term of this patent is extended or adjusted under 35 U.S.C. 154(b) by 52 days.

(21) Appl. No.: 17/075,849

(22) Filed: Oct. 21, 2020

(65) Prior Publication Data

US 2021/0035984 A1 Feb. 4, 2021

Related U.S. Application Data

(63) Continuation of application No. 16/193,453, filed on Nov. 16, 2018, now Pat. No. 10,847,519.

(30) Foreign Application Priority Data

Mar. 26, 2018 (KR) .................. 10-2018-0034450

(51) Int. Cl.
*H01L 27/108* (2006.01)
*H01L 21/768* (2006.01)
(Continued)

(52) U.S. Cl.
CPC .. *H01L 27/10888* (2013.01); *H01L 21/02126* (2013.01); *H01L 21/02129* (2013.01);
(Continued)

(58) Field of Classification Search
CPC ......... H01L 27/10888; H01L 21/02126; H01L 21/02129; H01L 21/02164;
(Continued)

(56) References Cited

U.S. PATENT DOCUMENTS

| 7,732,324 B2 * | 6/2010 | Ruan ................... H01L 23/5329 438/791 |
| 2007/0197021 A1 * | 8/2007 | Nam ................. H01L 21/76832 438/622 |

(Continued)

FOREIGN PATENT DOCUMENTS

| KR | 10-2007-0085015 A | 8/2007 |
| KR | 10-2015-0096183 A | 8/2015 |

OTHER PUBLICATIONS

Notice of Allowance issued by the Korean Intellectual Property Office dated Feb. 25, 2022.

*Primary Examiner* — John P. Dulka
(74) *Attorney, Agent, or Firm* — IP & T Group LLP

(57) ABSTRACT

A method for fabricating a semiconductor device includes forming a line structure including a first contact plug on a semiconductor substrate and a conductive line on the first contact plug, forming a low-k layer having a first low-k, which covers a top surface and side walls of the line structure, performing a converting process on the low-k layer to form a non-converting portion adjacent to side walls of the first contact plug and maintains the first low-k and a converting portion adjacent to side walls of the conductive line and having a second low-k that is lower than the first low-k, and forming a second contact plug which is adjacent to the first contact plug with the non-converting portion therebetween while being adjacent to the conductive line with the converting portion therebetween.

14 Claims, 12 Drawing Sheets

(51) Int. Cl.
*H01L 21/3213* (2006.01)
*H01L 21/02* (2006.01)
*H01L 21/311* (2006.01)

(52) U.S. Cl.
CPC .. *H01L 21/02164* (2013.01); *H01L 21/31144* (2013.01); *H01L 21/3213* (2013.01); *H01L 21/76826* (2013.01); *H01L 21/76895* (2013.01)

(58) Field of Classification Search
CPC .......... H01L 21/31144; H01L 21/3213; H01L 21/76826; H01L 21/76895; H01L 27/10814; H01L 27/10855; H01L 27/10885; H01L 21/76897; H01L 21/0254; H01L 21/76837; H01L 27/10867
See application file for complete search history.

(56) References Cited

U.S. PATENT DOCUMENTS

2015/0235950 A1* 8/2015 Han .................. H01L 27/10814
257/773
2016/0322364 A1 11/2016 Han et al.

* cited by examiner

SEMICONDUCTOR DEVICE HAVING LOW-K SPACER AND CONVERTING SPACER AND METHOD FOR FABRICATING THE SAME

CROSS-REFERENCE TO RELATED APPLICATIONS

This application is a continuation of U.S. patent application Ser. No. 16/193,453 filed on Nov. 16, 2018, which issued as U.S. Pat. No. 10,847,519 and which claims benefits of priority of Korean Patent Application No. 10-2018-0034450 filed on Mar. 26, 2018. The disclosure of each of the foregoing application is incorporated herein by reference in its entirety.

BACKGROUND

1. Field

The present invention relates generally to a semiconductor device and a method for fabricating the same. More particularly, the present invention relates to a semiconductor device including a low-k spacer and a method for fabricating the semiconductor device.

2. Description of the Related Art

In a semiconductor device, a dielectric material is formed between neighboring pattern structure. As semiconductor devices become more highly integrated, the distance between neighboring pattern structures gradually decreases. As a result, parasitic capacitance is increasing. As the parasitic capacitance increases, the performance of the semiconductor device decreases.

SUMMARY

Exemplary embodiments of the present invention are directed to a semiconductor device capable of reducing parasitic capacitance between neighboring pattern structures, and a method for fabricating the semiconductor device.

In accordance with an embodiment of the present invention, a method for fabricating a semiconductor device includes: forming a line structure including a first contact plug on a semiconductor substrate and a conductive line on the first contact plug; forming a low-k layer having a first low-k, which covers a top surface and side walls of the line structure; performing a converting process on the low-k layer to form a non-converting portion adjacent to side walls of the first contact plug and maintains the first low-k and a converting portion adjacent to side walls of the conductive line and having a second low-k that is lower than the first low-k; and forming a second contact plug which is adjacent to the first contact plug with the non-converting portion therebetween while being adjacent to the conductive line with the converting portion therebetween.

In accordance with an embodiment of the present invention, a semiconductor device includes: a conductive structure including a first contact plug and a conductive line on the first contact plug; a second contact plug; an initial spacer located between the first contact plug and the second contact plug; and a converting spacer which is extended vertically from the initial spacer to be located between the conductive line and the second contact plug and has a lower dielectric constant than the initial spacer, wherein the converting spacer includes an oxide converted from the initial spacer.

DETAILED DESCRIPTION

Figure 1:
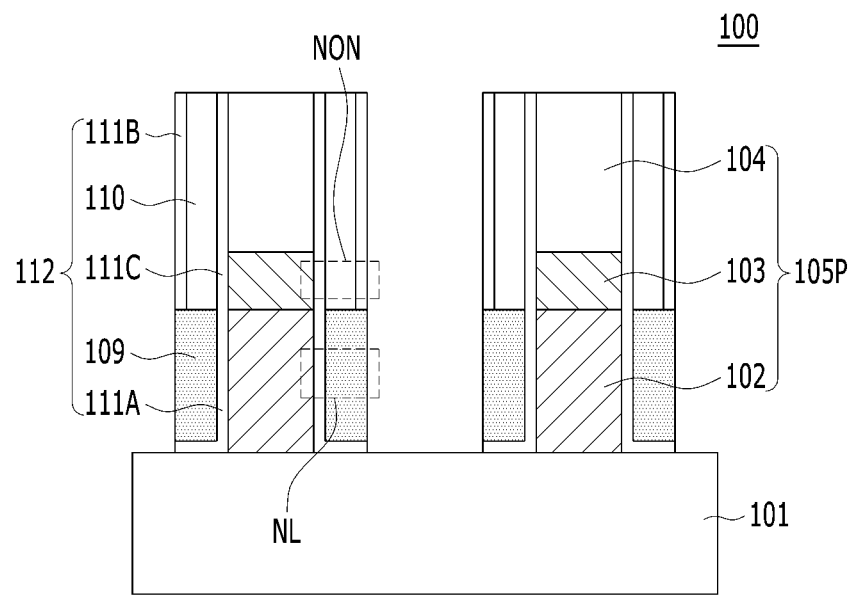
FIG. 1 is a cross-sectional view of a semiconductor device in accordance with an embodiment of the present invention.

Various examples and implementations of the disclosed technology are described below in detail with reference to the accompanying drawings.

The drawings may not necessarily be to scale and in some instances, proportions of structures in the drawings may have been exaggerated to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. Throughout the disclosure, like reference numerals refer to like parts in the various figures and embodiments of the present invention.

In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exist or are added.

Figure 2:
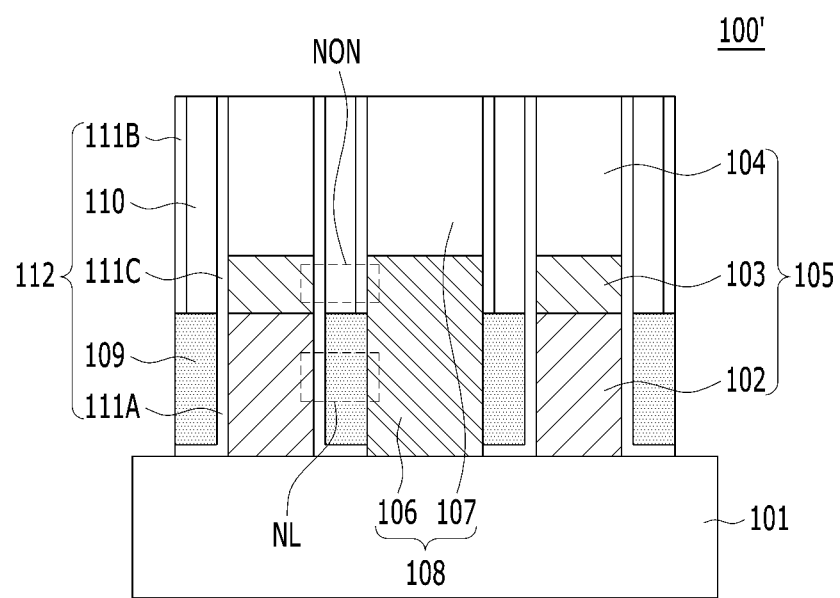
FIG. 2 is a cross-sectional view of a semiconductor device in accordance with an embodiment of the present invention.

FIG. 1 is a cross-sectional view of a semiconductor device 100 in accordance with an embodiment of the present invention. FIG. 2 is a cross-sectional view of a semiconductor device 100' in accordance with an embodiment of the present invention. Constituent elements of a dielectric structure 112 shown in FIGS. 1 and 2 may be the same.

Referring to FIG. 1, the semiconductor device 100 may include a substrate 101, pattern structures 105P, and a dielectric structure 112 formed on both side walls of each of the pattern structures 105P.

The plurality of pattern structures 105P may be formed on the substrate 101. Each of the pattern structures 105P may include a first conductive pattern 102 formed on the substrate 101. The pattern structure 105P may further include a second conductive pattern 103 formed on the first conductive pattern 102, and a hard mask pattern 104 formed on the second conductive pattern 103. The first conductive pattern 102 may be in direct contact with the substrate 101. Although not illustrated, the first conductive pattern 102 and the substrate 101 may be electrically isolated by an isolation material layer or a dielectric material layer. The first conductive pattern 102 and the second conductive pattern 103 may each be made of any suitable material, including, for example, a polysilicon, a metal, a metal nitride, a metal silicide or combinations thereof. In an embodiment, the first conductive pattern 102 and the second conductive pattern 103 may each be made of a different material. In another embodiment, the first conductive pattern 102 and the second conductive pattern 103 may be made of the same material. The hard mask pattern 104 may include a dielectric material.

The dielectric structure 112 may include a multi-layer dielectric material. The dielectric structure 112 may include a first dielectric material 109 located on side walls of the first conductive pattern 102. The dielectric structure 112 may further include a second dielectric material 110 having a lower dielectric constant than the first dielectric material 109. The second dielectric material 110 is being converted from the first dielectric material 109. The second dielectric material 110 may be located on side walls of the second conductive pattern 103.

The dielectric structure 112 may further include a plurality of third dielectric materials 111A, 111B and 111C. The third dielectric material 111A may contact the first dielectric material 109. A pair of third dielectric materials 111B and 111C may be located on either side of the second dielectric material 110. The second dielectric material 110 may be disposed between the pair of third dielectric materials 111B and 111C. The second dielectric material 110 may extend to the same height with the pair of third dielectric materials 111B and 111C in a direction perpendicular to the plane of the substrate 101.

As described above, the first dielectric material 109 and the third dielectric material 111A may be formed on the side walls of the first conductive pattern 102. The third dielectric material 111A may directly contact the side walls of the first conductive pattern 102, and the first dielectric material 109 may directly contact the third dielectric material 111A. In other words, the third dielectric material 111A may be disposed between the first conductive pattern 102 and the first dielectric material 109 and may be in direct contact with both. The pair of third dielectric materials 111B and 111C may be formed with the second dielectric material 110 therebetween on the side walls of the second conductive pattern 103.

The dielectric structure 112 is also referred to herein as a "spacer structure". Accordingly, the dielectric structure 112 may include a multi-layer spacer.

Referring to FIG. 2, the semiconductor device 100' may include a substrate 101, a first pattern structure 105, a second pattern structure 108, and a dielectric structure 112 formed between the first pattern structure 105 and the second pattern structure 108.

The first pattern structure 105 and the second pattern structure 108 may be formed on the substrate 101. The dielectric structure 112 may be formed between the first pattern structure 105 and the second pattern structure 108. The second pattern structure 108 may be located between two neighboring first pattern structures 105.

The first pattern structure 105 may be the same as the pattern structure 105P shown in FIG. 1. The first pattern structure 105 may include a first conductive pattern 102 formed on the substrate 101.

The first conductive pattern 102 may be formed directly on the substrate 101. The first pattern structure 105 may further include a second conductive pattern 103 formed on the first conductive pattern 102, and a hard mask pattern 104 formed on the second conductive pattern 103. The second conductive pattern 103 may be formed directly on the first conductive pattern 102, and the hard mask pattern 104 may be formed directly on the second conductive pattern 103.

The second pattern structure 108 may include a third conductive pattern 106. The second pattern structure 108 may further include a fourth conductive pattern 107 formed on the third conductive pattern 106. The fourth conductive pattern 107 may be formed directly on the third conductive pattern 106, and the third conductive pattern 106 may be formed directly on the substrate 101.

The dielectric structure 112 may include a multi-layer dielectric material. The dielectric structure 112 may include a first dielectric material 109 located between the first conductive pattern 102 and the third conductive pattern 106. The dielectric structure 112 may further include a second dielectric material 110 which has a lower dielectric constant than the first dielectric material 109. The second dielectric material 110 may be located between the second conductive pattern 103 and the third conductive pattern 106.

The dielectric structure 112 may further include a plurality of third dielectric materials 111A, 111B and 111C. The third dielectric material 111A may directly contact the first dielectric material 109. A pair of third dielectric materials 111B and 111C may be located with the second dielectric material 110 therebetween.

As described above, the first dielectric material 109 and the third dielectric material 111A may be formed between the first conductive pattern 102 and the third conductive pattern 106. The third dielectric material 111A may directly contact the side walls of the first conductive pattern 102, and the first dielectric material 109 may directly contact the side walls of the third conductive pattern 106. The second dielectric material 110 and the pair of third dielectric materials 111B and 111C may be formed between the second conductive pattern 103 and the third conductive pattern 106. The third dielectric material 111B may directly contact the side walls of the second conductive pattern 103, and the third dielectric material 111C may directly contact the side walls of the third conductive pattern 106.

The dielectric structure 112 is also referred to herein as a "spacer structure" or a "low-k spacer structure". Accordingly, the dielectric structure 112 may include a multi-layer spacer.

The dielectric structure 112 shown in FIG. 1 may have a dielectric constant which decreases parasitic capacitance between the neighboring pattern structures 105P. The dielectric structure 112 shown in FIG. 2 may have a dielectric constant which decreases parasitic capacitance between the first pattern structure 105 and the second pattern structure 108.

In FIGS. 1 and 2, each of the first dielectric material 109, the second dielectric material 110 and the third dielectric materials 111A, 111B and 111C may have a low dielectric constant. The first dielectric material 109 may have a first low dielectric constant. The second dielectric material 110 may have a second low dielectric constant. The third dielectric materials 111A, 111B and 111C may have a third low dielectric constant. The second low dielectric constant may be lower than the first low dielectric constant, and the first low dielectric constant may be lower than the third low dielectric constant. The first low dielectric constant may be equal to or lower than 5, the third low dielectric constant may be approximately 7.5, and the second low dielectric constant may be approximately 3.9. Each of the first dielectric material 109, the second dielectric material 110 and the third dielectric materials 111A, 111B and 111C may be a low-k material.

The second dielectric material 110 may be formed by being converted from the same material as the first dielectric material 109. For example, the same material as the first dielectric material 109 may be converted into a silicon oxide so that the second dielectric material 110 may be formed. Due to such a converting process, the second dielectric material 110 may have a lower dielectric constant than the first dielectric material 109. In order to convert the same material as the first dielectric material 109 into the silicon oxide, a radical oxidation process may be introduced.

The first dielectric material 109 may have an etch selectivity over the third dielectric materials 111A, 111B and 111C. For example, the first dielectric material 109 may have a lower etch rate than the third dielectric materials 111A, 111B and 111C. Accordingly, structural stability of the dielectric structure 112 may increase.

The first dielectric material 109 may have a low dielectric constant equal to or lower than 5. The first dielectric material 109 may include a silicon-based material. The first dielectric material 109 may contain an impurity. The low dielectric constant of the first dielectric material 109 may be obtained by the impurity. The first dielectric material 109 may include an impurity-containing silicon-based material. The impurity may include carbon, boron, or a combination thereof. The impurity-containing silicon-based material may include SiCO, SiCN, SiOCN, SiBN or SiBCN. Besides, due to the impurity, the first dielectric material 109 may have a lower etch rate than the third dielectric materials 111A, 111B and 111C.

The second dielectric material 110 may have a larger content of an oxide component than the first dielectric material 109. The second dielectric material 110 may be a silicon oxide that is oxidized from the first dielectric material 109. The second dielectric material 110 may be a silicon oxide that is oxidized from an impurity-containing silicon-based material so as to have a lower dielectric constant than the impurity-containing silicon-based material. The oxidized silicon oxide is also referred to herein as a converted silicon oxide. The converted silicon oxide may be obtained by the radical oxidation process.

The third dielectric material 111A, 111B and 111C may include a silicon nitride. The third dielectric material 111A, 111B and 111C may include a silicon nitride having no impurity (hereinafter abbreviated as an "undoped silicon nitride". The undoped silicon nitride may be $Si_xN_y$ or $Si_3N_4$.

The dielectric structure 112 may include a Nitride-Oxide-Nitride (NON) structure and a Nitride-Low k (NL) structure. Referring to FIG. 2, the NL structure may be formed by stacking the third dielectric material 111A and the first dielectric material 109. Referring to FIG. 2, the NON structure may be formed by stacking the third dielectric material 111B, the second dielectric material 110 and the third dielectric material 111C. For example, the NL structure may include a stack structure of an undoped silicon nitride and a low-k material. The NL structure may include a stack structure of an undoped silicon nitride and an impurity-containing silicon-based material. The NON structure may include a stack structure of an undoped silicon nitride, a converted silicon oxide and an undoped silicon nitride.

In FIGS. 1 and 2, the semiconductor devices 100 and 100' may be parts of a memory cell.

The first conductive pattern 102 included in the pattern structure 105P and first pattern structure 105 may be a first contact plug. The second conductive pattern 103 may be a conductive line. The second pattern structure 108 may be a second contact plug. The first dielectric material 109 is also referred to herein as a non-converting spacer, and the second dielectric material 110 is also referred to herein as a converting spacer. The dielectric structure 112 may be a multi-layer low-k spacer. Accordingly, the dielectric structure 112 may decrease the parasitic capacitance between the first contact plug and the second contact plug.

Each of the pattern structure 105P and the first pattern structure 105 may be a bit line structure. The first conductive pattern 102 may be a bit line contact plug. The second conductive pattern 103 may be a bit line. The second pattern structure 108 may be a storage node contact plug. The dielectric structure 112 may be a bit line spacer. Accordingly, the dielectric structure 112 may decrease the parasitic capacitance between the bit line contact plug and the storage node contact plug. Besides, the dielectric structure 112 may decrease parasitic capacitance between the bit line and the storage node contact plug.

In some embodiments, each of the first conductive pattern 102 and the second conductive pattern 103 may be a gate electrode of a transistor. The second pattern structure 108 may be a contact plug coupled to a source/drain region of the transistor. The dielectric structure 112 may be a gate spacer or a contact spacer. Accordingly, the dielectric structure 112 may decrease the parasitic capacitance between the gate electrode and the contact plug.

In some embodiments, the pattern structure 105P may be a metal line having a line shape. Accordingly, the dielectric structure 112 may decrease the parasitic capacitance between neighboring metal lines.

Figure 3:
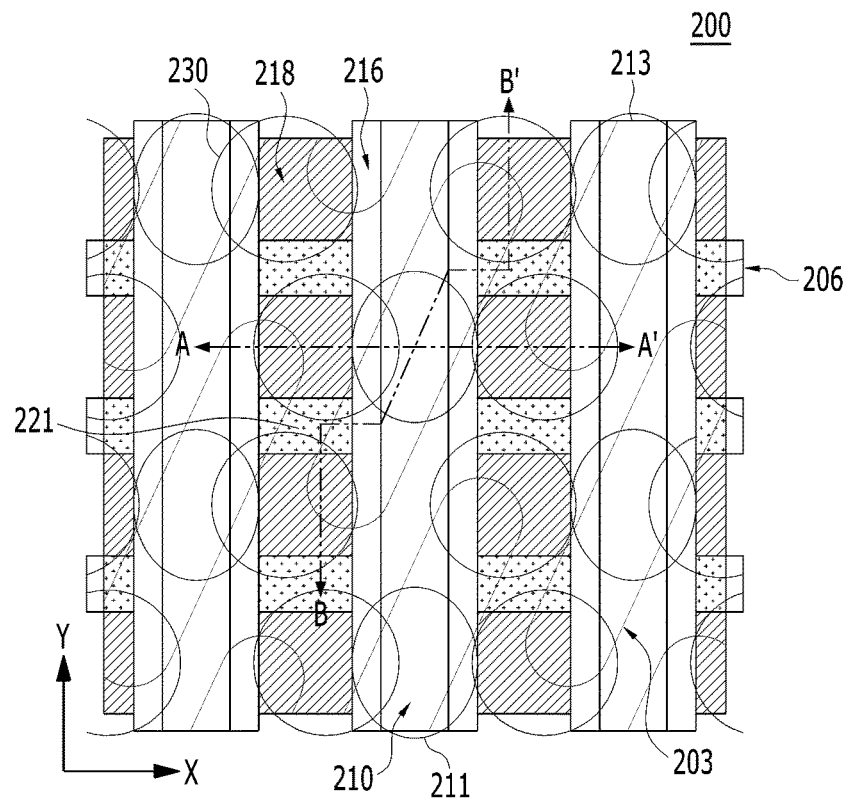
FIG. 3 is a plan view illustrating a semiconductor device in accordance with an embodiment of the present invention.
Figure 4A:
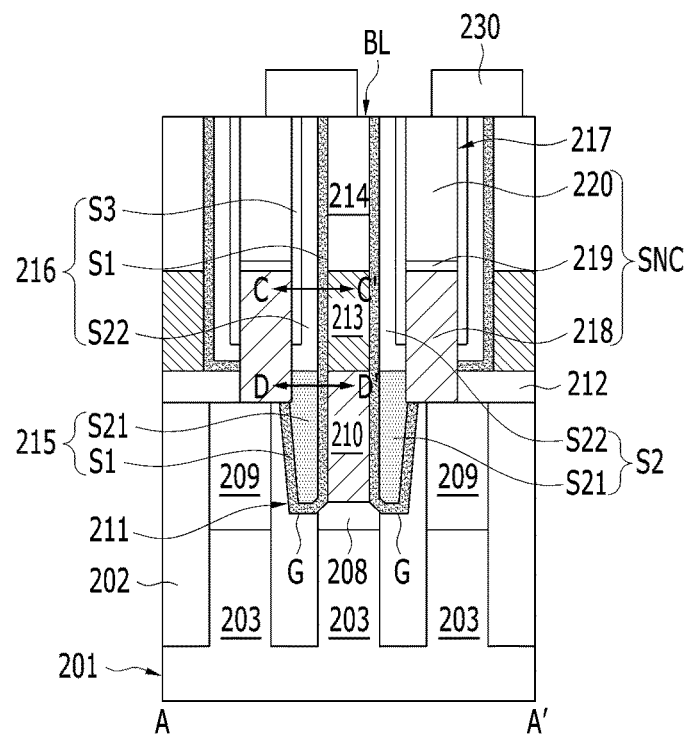
FIG. 4A is a cross-sectional view of a semiconductor device shown in FIG. 3 taken along a line A-A'.
Figure 4B:
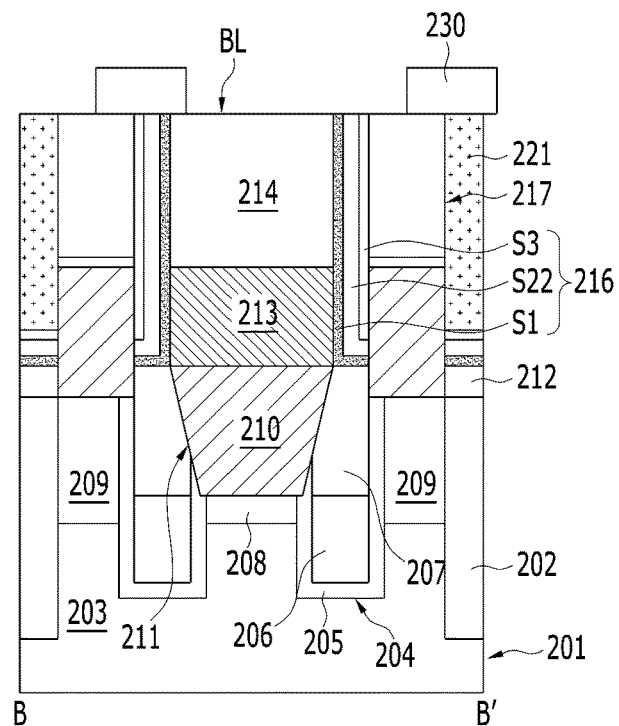
FIG. 4B is a cross-sectional view of a semiconductor device shown in FIG. 3 taken along a line B-B'.
Figure 4C:
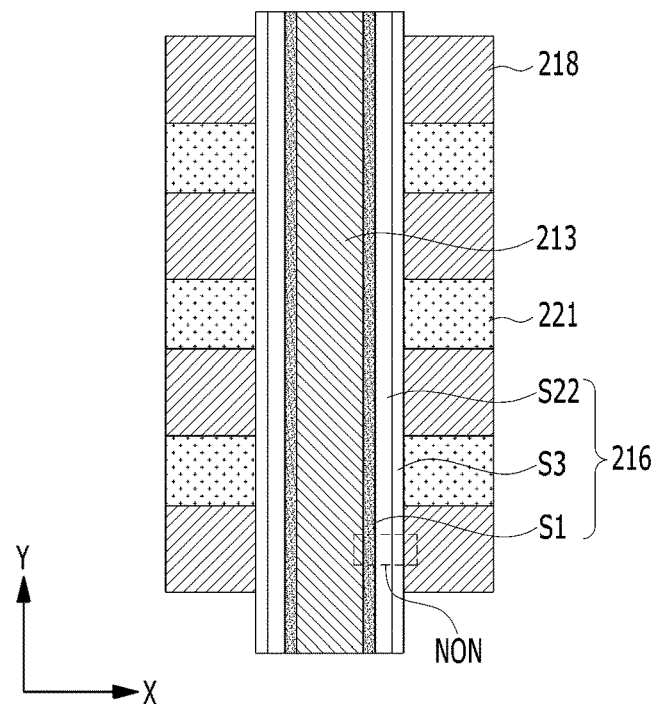
FIG. 4C is a cross-sectional view of a semiconductor device shown in FIG. 4A taken along a line C-C'.
Figure 4D:
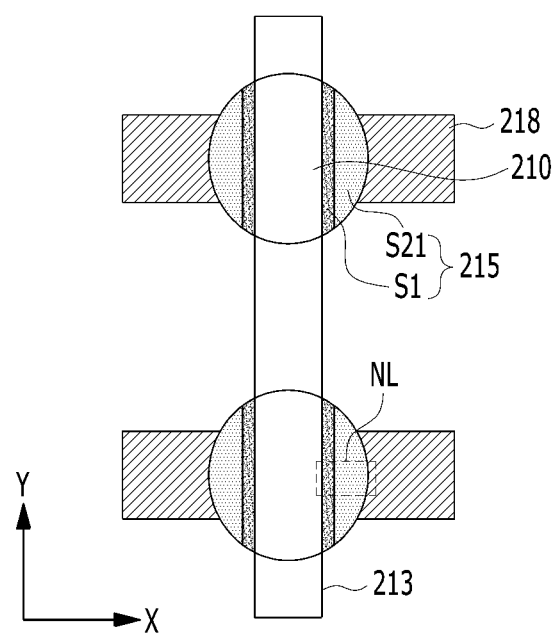
FIG. 4D is a cross-sectional view of a semiconductor device shown in FIG. 4A taken along a line D-D'.

FIG. 3 is a plan view illustrating a semiconductor device 200 in accordance with an embodiment of the present invention. FIG. 4A is a cross-sectional view of the semiconductor device 200 taken along a line A-A' shown in FIG. 3. FIG. 4B is a cross-sectional view of the semiconductor device 200 taken along a line B-B' shown in FIG. 3. FIG. 4C is a cross-sectional view of the semiconductor device 200 taken along a line C-C' shown in FIG. 4A. FIG. 4D is a cross-sectional view of the semiconductor device 200 taken along a line D-D' shown in FIG. 4A.

The semiconductor device 200 may include a plurality of memory cells. Each of the memory cells may include a cell transistor including a buried word line 206, a bit line 213, and a memory element 230.

An isolation layer 202 and an active region 203 may be formed in a substrate 201. A plurality of active regions 203 may be defined by the isolation layer 202. The substrate 201 may be a material suitable for semiconductor processing. The substrate 201 may include a semiconductor substrate. The substrate 201 may be formed of a material containing silicon. The substrate 201 may include silicon, single crystal silicon, polysilicon, amorphous silicon, silicon germanium, single crystal silicon germanium, polycrystal silicon germanium, silicon doped with carbon, combinations thereof or multi layers thereof. The substrate 201 may include a semiconductor material such as germanium. The substrate 201 may include an III/V kind semiconductor substrate, for example, a compound semiconductor substrate such as GaAs. The substrate 201 may include a silicon on insulator (SOI) substrate. The isolation layer 202 may be formed by a shallow trench isolation (STI) process.

A gate trench 204 may be formed in the substrate 201. A gate dielectric layer 205 may be formed on a surface of the gate trench 204. The gate dielectric layer 205 may be formed conformally, directly on an internal surface of the gate trench 204. A buried word line 206 that partially fills the gate trench 204 may be formed on the gate dielectric layer 205. A gate capping layer 207 may be formed on the buried word line 206. The gate capping layer 207 may be formed directly on the buried word line 206. A top surface of the buried word line 206 may be at a lower level than a top surface of the substrate 201. The buried word line 206 may be formed of a low resistance metal material. The buried word line 206 may be formed by sequentially stacking a titanium nitride and tungsten. In some embodiments, the buried word line 206 may be formed of a titanium nitride (TiN) only. The buried word line 206 is also referred to herein as a "buried gate electrode".

First and second impurity regions 208 and 209 may be formed in the substrate 201. The first and second impurity regions 208 and 209 may be spaced apart from each other by the gate trench 204. The first and second impurity regions 208 and 209 is also referred to herein as source/drain regions. The first and second impurity regions 208 and 209 may include an N-type impurity such as arsenic (As) or phosphorus (P). Accordingly, the buried word line 206 and the first and second impurity regions 208 and 209 may form cell transistors. The cell transistors may improve a short channel effect through the buried word line 206.

A bit line contact plug 210 may be formed in the substrate 201. The bit line contact plug 210 may be coupled to the first impurity region 208. The bit line contact plug 210 may be coupled directly to the first impurity region 208. The bit line contact plug 210 may be located in a bit line contact hole 211. The bit line contact plug 210 may fill a bottom portion of the bit line contact hole 211. The bit line contact hole 211 may be formed in a hard mask layer 212. The hard mask layer 212 may be formed on the substrate 201. The hard mask layer 212 may include a dielectric material. The bit line contact hole 211 may expose the first impurity region 208. A bottom surface of the bit line contact plug 210 may be at a lower level than a top surface of the substrate 201. The bit line contact plug 210 may be formed of polysilicon or a metal material. A portion of the bit line contact plug 210 may have a smaller line width than a diameter of the bit line contact hole 211. The bit line 213 may be formed on the bit line contact plug 210. A bit line hard mask 214 may be formed on the bit line 213. The bit line 213 may be formed directly on the bit line contact plug 210 and the bit line hard mask 214 may be formed directly on the bit line 213. A stack structure of the bit line contact plug 210, the bit line 213 and the bit line hard mask 214 is also referred to herein as a "bit line structure BL". The bit line 213 may have a line shape extended in a direction intersecting the buried word line 206. For example, the bit line 213 may have a line shape extended in a direction perpendicularly intersecting the buried word line 206. A portion of the bit line 213 may be coupled to the bit line contact plug 210. A portion of the bit line 213 may be directly coupled to the bit line contact plug 210. In an A-A' direction, the bit line 213 and the bit line contact plug 210 may have the same line width. Accordingly, the bit line 213 may be extended in any one direction while covering the bit line contact plug 210. The bit line 213 may include a metal material. The bit line hard mask 214 may include a dielectric material.

A first spacer structure 215 may be formed on a bottom side wall of the bit line structure BL. A second spacer structure 216 may be formed on a top side wall of the bit line structure BL. The second spacer structure 216 may be formed on both side walls of the bit lines 213 and the bit line hard mask 214. The first spacer structure 215 may be formed on both side walls of the bit line contact plug 210. The first spacer structure 215 may be formed directly on the bottom side wall of the bit line structure BL and the second spacer structure 216 may be formed directly on the top side wall of the bit line structure BL. The bit line contact hole 211 may be filled with the bit line contact plug 210 and the first spacer structure 215. The bit line contact hole 211 may include a gap G defined on both sides of the bit line contact plug 210. The first spacer structure 215 may fill inside of the gap G. The second spacer structure 216 may be extended parallel to both side walls of the bit line 213.

A storage node contact plug SNC may be formed between neighboring bit line structures BL. The storage node contact plug SNC may be formed in a storage node contact hole 217. The storage node contact hole 217 may have a high aspect ratio. The storage node contact plug SNC may be coupled to the second impurity region 209. The storage node contact plug SNC may be directly coupled to the second impurity region 209. The storage node contact plug SNC may include a bottom plug 218 and a top plug 220. The storage node contact plug SNC may further include an ohmic contact layer 219 disposed between the bottom plug 218 and the top plug 220.

The ohmic contact layer 219 may include a metal silicide. The bottom plug 218 may include polysilicon, and the top plug 220 may include a metal material.

When viewed in a direction parallel to the bit line structure BL, a plug isolation layer 221 may be formed between neighboring storage node contact plugs SNC. The plug isolation layer 221 may be formed between the neighboring bit line structures BL, and provide the storage node contact hole 217 together with the hard mask layer 212. The neighboring storage node contact plugs SNC may be isolated by the plug isolation layer 221. A plurality of plug isolation layers 221 and a plurality of storage node contact plugs SNC may be alternately located between the neighboring bit line structures BL.

The memory element 230 may be formed on the top plug 220. The memory element 230 may be in direct contact with the top plug 220. The memory element 230 may partially overlap with the top plug 220 in a direction vertical to the plane of the substrate 201. The memory element 230 may include a capacitor including a storage node. The storage node may include a pillar type. Although not illustrated, a dielectric layer and a plate node may be formed on the storage node. The storage node may be of a cylinder type other than the pillar type.

The first spacer structure 215 and the second spacer structure 216 are described in detail below.

The first spacer structure 215 may be located between the bit line contact plug 210 and the bottom plug 218 of the storage node contact plug SNC. The second spacer structure 216 may be located between the bit line 213 and the bottom plug 218 of the storage node contact plug SNC.

The first spacer structure 215 and the second spacer structure 216 may include a plurality of low-k spacers.

A first spacer S1 may be formed on the side wall of the bit line structure BL. The first spacer S1 may contact the side wall of the bit line 213. The first spacer S1 may directly contact the side wall of the bit line 213. A bottom portion of the first spacer S1 may be extended to directly contact the side wall of the bit line contact plug 210. The bottom portion of the first spacer S1 may line a portion of a surface of the gap G. A pair of first spacers S1 may be formed on both side walls of the bit line structure BL.

A second spacer S2 may be formed on the first spacer S1.

The second spacer S2 may be located on the side wall of the bit line 213. A bottom portion of the second spacer S2 may directly contact the bottom portion of the first spacer S1. The bottom portion of the second spacer S2 may directly contact the bottom plug 218 of the storage node contact plug SNC. A pair of second spacers S2 may be located on both side walls of the bit line structure BL.

A third spacer S3 may be formed on the second spacer S2.

The third spacer S3 may directly contact the storage node contact plug SNC. The third spacer S3 may not contact the bottom portion of the second spacer S2. A pair of third spacers S3 may be located on both side walls of the bit line structure BL.

The first spacer S1, the second spacer S2 and the third spacer S3 may be low-k materials. The first spacer S1, the second spacer S2 and the third spacer S3 may be made of the same or different low-k material. The first spacer S1, the second spacer S2 and the third spacer S3 are also referred to herein as a first low-k spacer, a second low-k spacer and a third low-k spacer, respectively.

The second spacer S2 may include a non-converting portion S21 and a converting portion S22. The converting portion S22 may include a material which is converted from the same material as the non-converting portion S21. The converting portion S22 may include an oxide which is oxidized from the non-converting portion S21. For example, the converting portion S22 may be formed by converting the non-converting portion S21 into a silicon oxide. Through such a converting process, the converting portion S21 may have a lower dielectric constant than the non-converting portion S22. In order to convert the non-converting portion S21 into the silicon oxide, the radical oxidation process may be introduced.

The non-converting portion S21 may have an etch selectivity over the first and third spacers S1 and S3. For example, the non-converting portion S21 may have a lower etch selectivity than the first and third spacers S1 and S3. Accordingly, structural stability of the second spacer S2 may increase.

The non-converting portion S21 may have a low dielectric constant equal to or lower than 5. The non-converting portion S21 may include a silicon-based material. The non-converting portion S21 may contain an impurity. The low dielectric constant of the non-converting portion S21 may be obtained by the impurity. The non-converting portion S21 may include an impurity-containing silicon-based material. The impurity may include carbon, boron, or a combination thereof. The impurity-containing silicon-based material may include SiCO, SiCN, SiOCN, SiBN or SiBCN. In addition, the non-converting portion S21 may have a lower etch rate than the first and third spacers S1 and S3.

The converting portion S22 may have a larger content of an oxide component than the non-converting portion S21. The converting portion S22 may be a silicon oxide oxidized from the impurity-containing silicon-based material to have a lower dielectric constant than the impurity-containing silicon-based material. The converting portion S22 may be smaller in width than the non-converting portion S21.

The first and third spacers S1 and S3 may be made of the same material. The first and third spacers S1 and S3 may include a silicon nitride. The first and third spacers S1 and S3 may include a silicon nitride containing no impurity (hereinafter referred to as an "undoped silicon nitride"). The undoped silicon nitride may be SixNy or $Si_3N_4$. A dielectric constant of the first and third spacers S1 and S3 may be approximately 7.5. The undoped silicon nitride is also referred to herein as a conventional silicon nitride.

The converting portion S22 may have a lower dielectric constant than the first and third spacers S1 and S3. A dielectric constant of the converting portion S22 may be approximately 3.9. The non-converting portion S21 may have a lower dielectric constant than the first and third spacers S1 and S3. A dielectric constant of the non-converting portion S21 may be equal to or lower than 5. The converting portion S22 may have a lower dielectric constant than the non-converting portion S21, the first spacer S1 and the third spacer S3.

The non-converting portion S21 may be located on the side wall of the bit line contact plug 210. The converting portion S22 may be located on the side wall of the bit line 213. The converting portion S22 may also be located on the side wall of the bit line hard mask 214. The non-converting portion S21 may fill the gap G on both side walls of the big line contact plug 210. The non-converting portion S21 may have a plug shape. The converting portion S22 may have a line shape extended parallel to both side walls of the bit line 213 when viewed from the top.

The first spacer structure 215 may include the first spacer S1 and the non-converting portion S21. The second spacer structure 216 may include the first spacer S1, the converting portion S22 and the third spacer S3. The non-converting portion S21 is also referred to herein as an "initial spacer". The converting portion S22 is also referred to herein as a "converting spacer".

The first spacer structure 215 may include a nitride low-k (NL) structure. The second spacer structure 216 may include a nitride-oxide-nitride (NON) structure. The NL structure may be formed by sequentially stacking the first spacer S1 and the non-converting portion S21. The NON structure may be formed by sequentially stacking the first spacer 1, the converting portion S22 and the third spacer S3.

Referring to FIGS. 3, 4A to 4D, the first spacer structure 215 may decrease the parasitic capacitance between the bit line contact plug 210 and the bottom plug 218. The first spacer structure 215 is formed so that the non-converting portion S21 may occupy a maximum volume in the first spacer structure 215. Hence, the non-converting portion S21 may be thicker than the first spacer S1. In an exemplary embodiment, the first spacer S1 may be approximately 1 nm thick, and the non-converting portion S21 may be thicker than 2 nm. Due to such a difference in thickness, a content of the non-converting portion S21 occupying in the first spacer structure 215 may increase. Consequently, by allowing the non-converting portion S21 to be included in the first spacer structure 215 in a maximum amount, and, preferably, in an amount greater than the first spacer S1, the parasitic capacitance may be further reduced substantially.

The second spacer structure 216 may decrease the parasitic capacitance between the bit line 213 and the bottom plug 218. The second spacer structure 216 is formed so that the converting portion S22 may occupy a maximum volume in the second spacer structure 216. For example, the converting portion S22 may be thicker than the first spacer S1 and the third spacer S3. The first spacer S1 and the third spacer S3 may each be approximately 1 nm thick, and the converting portion S22 may be thicker than 2 nm. By controlling the thicknesses of S1, S3 and S22 the content of the converting portion S22 occupying in the second spacer structure 216 may be increased. Consequently, by allowing the converting portion S22 to be included in the second spacer structure 216 in a greater thickness than the combined thicknesses of S1 and S3, the parasitic capacitance between the bit line 213 and the bottom plug 218 may be further reduced substantially.

Since the non-converting portion S21 of the first spacer structure 215 includes an impurity-containing low-k material, the structural stability of the first spacer structure 215 may also increase. As a comparative example, when the first spacer structure 215 is formed of only a conventional silicon nitride, it may be difficult to decrease the parasitic capacitance between the bit line contact plug 210 and the bottom plug 218. As another comparative example, the first spacer structure 215 may include a conventional silicon oxide ($SiO_2$). The conventional silicon oxide ($SiO_2$) may be a different material from the impurity-containing silicon-based material, for example, SiCO. The conventional silicon oxide ($SiO_2$) may be a different material from the converted silicon oxide of the converting portion S22. In the case of the latter comparative example, the structural stability of the first spacer structure 215 may deteriorate due to an etch loss of the conventional silicon oxide. For example, when the conventional silicon oxide is lost, the bit line contact plug 210 and the bottom plug 218 may be short. Since the non-converting portion S21 of the first spacer structure 215 has a small etch rate, the non-converting portion S21 may not be lost during an etch process for forming the first and third spacers S1 and S3. In addition, the non-converting portion S21 of the first spacer structure 215 may not be lost during an etch process for forming the storage node contact hole 217.

FIGS. 5 to 19 are cross-sectional views illustrating a method for fabricating the semiconductor device 200 taken along lines A-A' and B-B' shown in FIG. 3 in accordance with an embodiment of the present invention.

Figure 5:
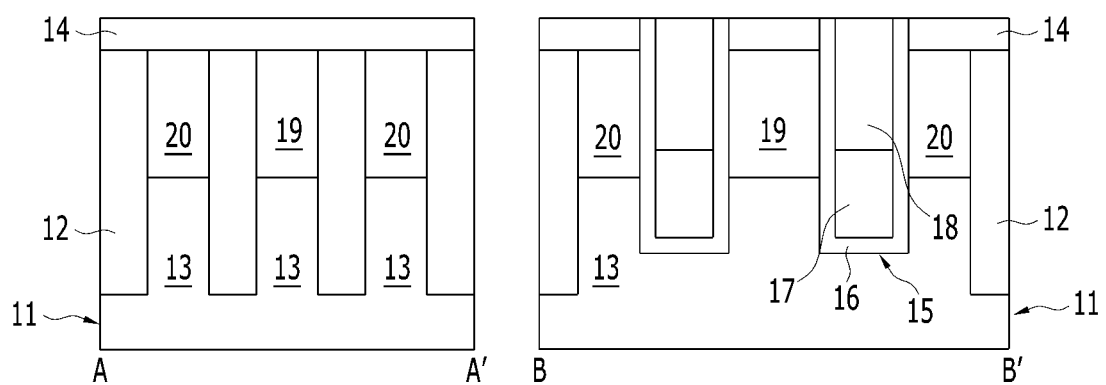
FIGS. 5 to 19 are cross-sectional views illustrating a method for fabricating the semiconductor device in accordance with an embodiment of the present invention.

Referring to FIG. 5, an isolation layer 12 may be formed in a substrate 11. An active region 13 may be defined by the isolation layer 12. The isolation layer 12 may be formed by a shallow trench isolation (STI) process. The STI process may be as follows. An isolation trench (not illustrated) may be formed by etching the substrate 11. The isolation trench may be filled with a dielectric material, and consequently the isolation layer 12 may be formed. The isolation layer 12 may include a silicon oxide, a silicon nitride or a combination thereof. A chemical vapor deposition (CVD) process or other deposition processes may be used to fill the isolation trench with a dielectric material. A planarization process such as a chemical-mechanical polishing (CMP) process may be additionally used.

Subsequently, a buried word line structure may be formed in the substrate 11. The buried word line structure may include a gate trench 15, a gate dielectric layer 16 which conformally covers a bottom surface and side walls of the gate trench 15, a buried word line 17 which partially fills the gate trench 15 on the gate dielectric layer 16, and a gate capping layer 18 which is formed on the buried word line 17.

A method for forming the buried word line structure may be as follows.

The gate trench 15 may be formed in the substrate 11. The gate trench 15 may have a line shape traversing the active region 13 and the isolation layer 12. The gate trench 15 may be formed by an etch process using a mask pattern (not illustrated) formed on the substrate 11 as an etch mask. In order to form the gate trench 15, a hard mask layer 14 may be used as an etch barrier. The hard mask layer 14 may have a shape patterned by the mask pattern. In an embodiment, the hard mask layer 14 may include a silicon oxide. For example, in an embodiment, the hard mask layer 14 may include tetraethyl orthosilicate (TEOS). A bottom surface of the gate trench 15 may be at a higher level than a bottom surface of the isolation layer 12. The gate trench 15 may have a sufficient depth to increase an average cross-sectional area of a subsequent buried word line electrode. Accordingly, resistance of a gate electrode may decrease. In some embodiments, a bottom edge of the gate trench 15 may have a curvature to facilitate the filling of the gate electrode.

Although not illustrated, a portion of the isolation layer 12 may be recessed, and the active region below the gate trench 15 may protrude. For example, in a line B-B' direction of FIG. 3, the isolation layer 12 below the gate trench 15 may be selectively recessed. Accordingly, a fin region (not illustrated) below the gate trench 15 may be formed. The fin region may be a portion of a channel region.

Subsequently, the gate dielectric layer 16 may be formed on the bottom surface and side walls of the gate trench 15. Before the gate dielectric layer 16 is formed, an etch loss of a surface of the gate trench 15 may be cured. For example, after a sacrificial oxide is formed by a thermal oxidation process, the sacrificial oxide may be removed.

The gate dielectric layer 16 may be formed by the thermal oxidation process. For example, the gate dielectric layer 16 may be formed by oxidizing the bottom and side walls of the gate trench 15.

In some embodiments, the gate dielectric layer 16 may be formed by a deposition process such as a chemical vapor deposition (CVD) process or an atomic layer deposition (ALD) process. The gate dielectric layer 16 may include a high-k material, an oxide, a nitride, an oxynitride or combinations thereof. The high-k material may include a hafnium-containing material. The hafnium-containing material may be, for example, a hafnium oxide, a hafnium silicon oxide, a hafnium silicon oxynitride or combinations thereof. In some embodiments, the high-k material may be, for example, a lanthanum oxide, a lanthanum aluminum oxide, a zirconium oxide, a zirconium silicon oxide, a zirconium silicon oxynitride, an aluminum oxide and combinations thereof. Other high-k materials, which are well known to those skilled in the art, may be selectively used for the high-k material.

In some embodiments, after a liner polysilicon layer is deposited, the gate dielectric layer 16 may be formed by radical-oxidizing the liner polysilicon layer.

In some embodiments, after a liner silicon nitride layer is formed, the gate dielectric layer 16 may be formed by radical-oxidizing the liner silicon nitride layer.

Subsequently, the buried word line 17 may be formed on the gate dielectric layer 16. In order to form the buried word line 17, a conductive layer (not illustrated) may be formed to fill the gate trench 15, and subsequently a recessing process may be performed. The recessing process may be performed as an etch-back process or sequentially performed as the CMP process and an etch-back process. The buried word line 17 may have a recessed shape that partially fills the gate trench 15. That is, a top surface of the buried word line 17 may be at a lower level than a top surface of the active region 13. The buried word line 17 may include a metal, a metal nitride or a combination thereof. For example, the buried word line 17 may be formed of a titanium nitride (TiN), tungsten (W) or a titanium nitride/tungsten (TiN/W). After the titanium nitride is conformally formed, the titanium nitride/tungsten (TiN/W) may have a structure where the gate trench 15 is partially filled using tungsten. The titanium nitride may be solely used for the buried word line 17, which is referred to as the buried word line 17 having a "TiN Only" structure.

Subsequently, the gate capping layer 18 may be formed on the buried word line 17. The gate capping layer 18 may be formed directly on the buried word line 17. The gate capping layer 18 may include a dielectric material. Remaining portions of the gate trench 15 on the buried word line 17 may be filled with the gate capping layer 18. The gate capping layer 18 may include a silicon nitride. In some embodiments, the gate capping layer 18 may include a silicon oxide. In some embodiments, the gate capping layer 18 may have a nitride-oxide-nitride (NON) structure. A top surface of the gate capping layer 18 may be at the same level as a top surface of the hard mask layer 14. To this end, when the gate capping layer 18 is formed, a CMP process may be performed.

After the gate capping layer 18 is formed, a first impurity region 19 and a second impurity region 20 may be formed. The first impurity region 19 and the second impurity region 20 may be formed by a doping process such as an implanting process. The first impurity region 19 and the second impurity region 20 may be doped with an impurity of the same conductive type. The first impurity region 19 and the second impurity region 20 may have the same depth. In some embodiments, the first impurity region 19 may be deeper than the second impurity region 20. The first impurity region 19 and the second impurity region 20 are also referred to herein as source/drain regions. The first impurity region 19 may be coupled to a bit line contact plug. The second impurity region 20 may be coupled to a storage node contact plug.

A cell transistor of a memory cell may be formed by the buried word line 17, the first impurity region 19 and the second impurity region 20.

Figure 6:
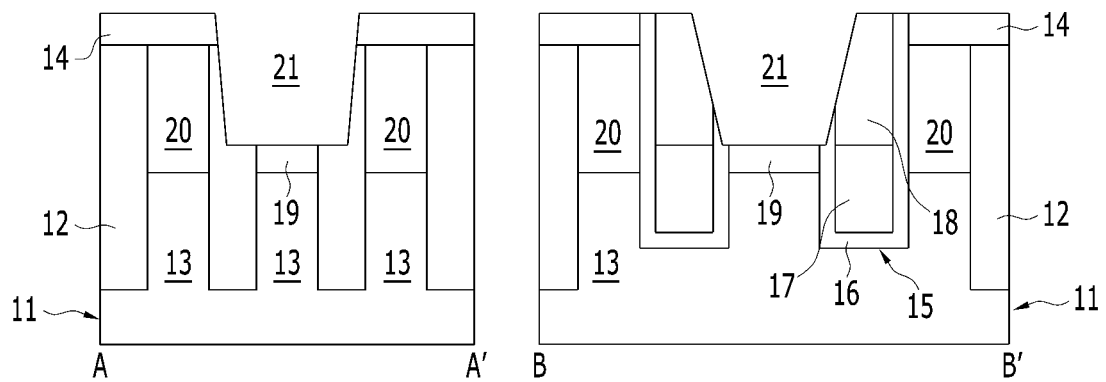

Referring to FIG. 6, a first contact hole 21 may be formed. In order to form the first contact hole 21, the hard mask layer 14 may be etched using a contact mask (not illustrated). The first contact hole 21 may have a circular shape or an oval shape in a plan view. A portion of the substrate 11 may be exposed by the first contact hole 21. The first contact hole 21 may have a diameter controlled to a predetermined line width. The first contact hole 21 may be shaped to expose a portion of the active region 13. For example, the first impurity region 19 may be exposed by the first contact hole 21. The first contact hole 21 may have a diameter larger than a minor axis width of the exposed active region 13. Accordingly, a portion of the first impurity region 19, isolation layer 12 and gate capping layer 18 may be etched during an etch process for forming the first contact hole 21. In other words, the gate capping layer 18, the first impurity region 19 and the isolation layer 12 below the first contact hole 21 may be recessed with a predetermined depth. Accordingly, a bottom of the first contact hole 21 may be extended into the substrate 11. As the first contact hole 21 is extended, a surface of the first impurity region 19 may be recessed, and the recessed surface of the first impurity region 19 may be at a lower level than the surface of the active region 13. The first contact hole 21 is also referred to herein as a bit line contact hole.

Figure 7:
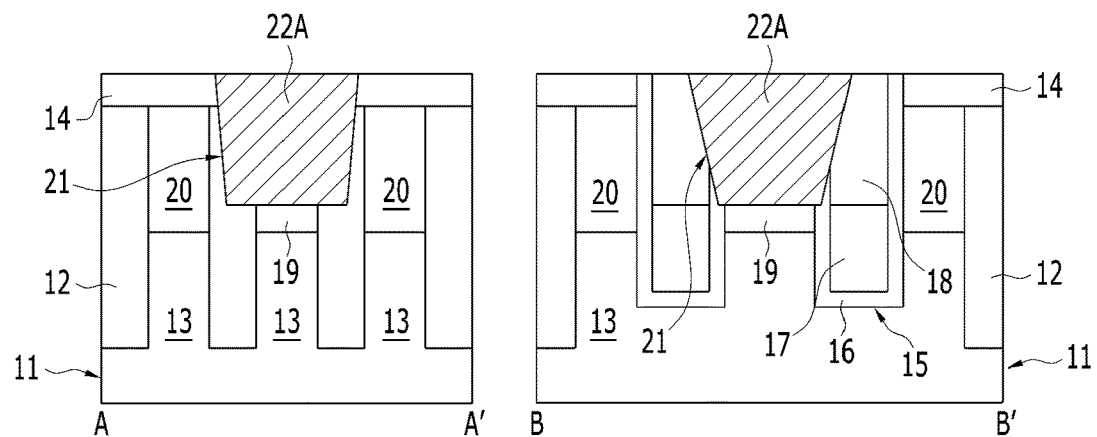

Referring to FIG. 7, a preliminary plug 22A may be formed. The preliminary plug 22A may be formed by a selective epitaxial growth (SEG) process. For example, the preliminary plug 22A may include a SEG SiP. The preliminary plug 22A may be formed by the SEG process without a void. In some embodiments, the preliminary plug 22A may be formed by a polysilicon layer deposition process followed by a CMP process. The preliminary plug 22A may fill the first contact hole 21. A top surface of the preliminary plug 22A may be at the same level as the top surface of the hard mask layer 14.

Figure 8:
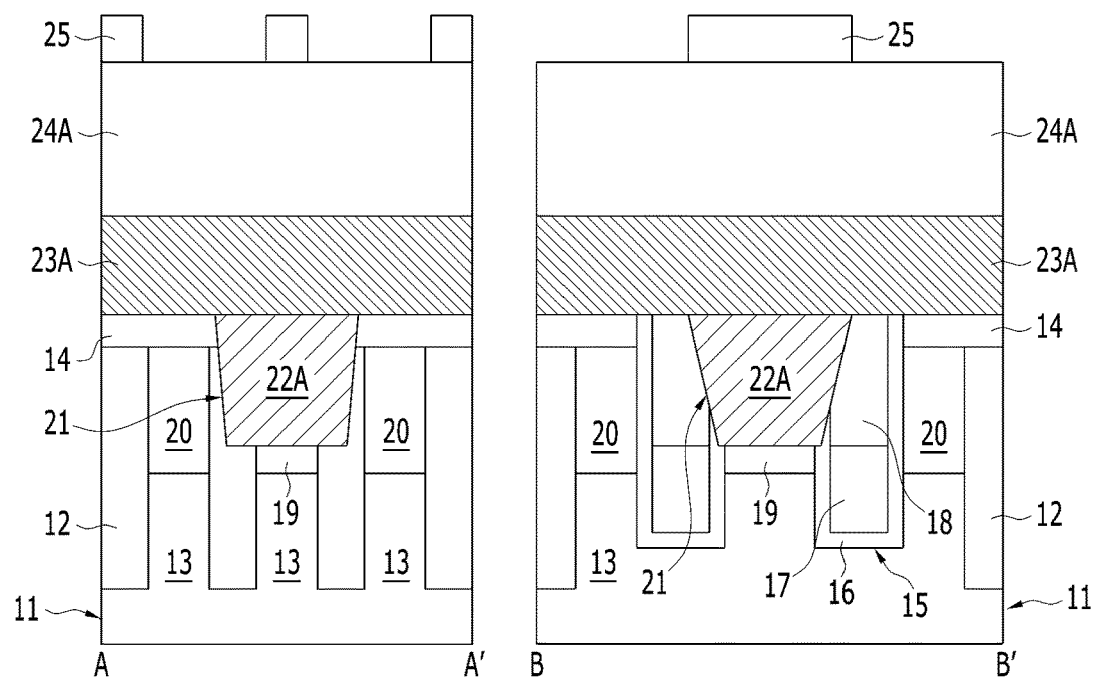

Referring to FIG. 8, a bit line conductive layer 23A and a bit line hard mask layer 24A may be stacked over the structure of FIG. 7. The preliminary plug 22A and the bit line conductive layer 23A and bit line hard mask layer 24A on the hard mask layer 14 may be sequentially stacked. The bit line conductive layer 23A may include a metal-containing material. The bit line conductive layer 23A may include a metal, a metal nitride, a metal silicide or combinations thereof. In an embodiment, the bit line conductive layer 23A may include tungsten (W). In some embodiments, the bit line conductive layer 23A may include a stacked layer of a titanium nitride and tungsten (TiN/W). The titanium nitride may serve as a barrier. The bit line hard mask layer 24A may be formed of a dielectric material having an etch selectivity over the bit line conductive layer 23A and the preliminary plug 22A. The bit line hard mask layer 24A may include a silicon oxide or a silicon nitride. In an embodiment, the bit line hard mask layer 24A may be formed of the silicon nitride.

A bit line mask layer 25 may be formed on the bit line hard mask layer 24A. The bit line mask layer 25 may include a photoresist pattern. The bit line mask layer 25 may be formed by a patterning method such as, for example, spacer patterning technology (SPT) and double patterning technology (DPT). When viewed from a top, the bit line mask layer 25 may have a line shape extending in any one direction.

Figure 9:
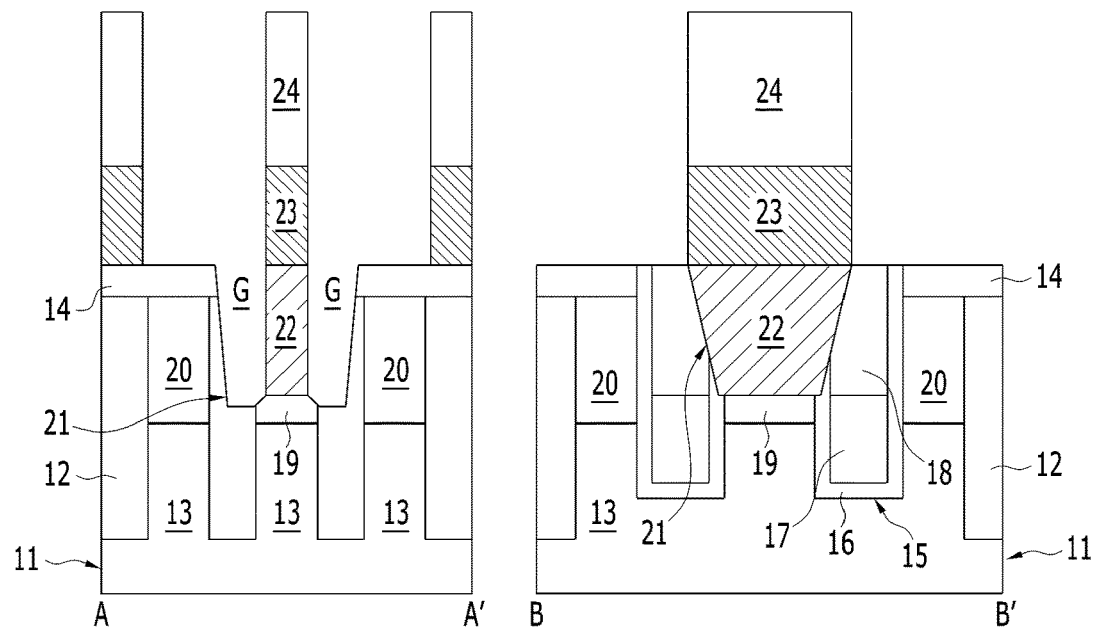

Referring to FIG. 9, a bit line 23 and a bit line contact plug 22 may be formed. The bit line 23 and the bit line contact plug 22 may be formed at the same time. The bit line 23 and the bit line contact plug 22 may be formed by an etch process using the bit line mask layer 25.

The bit line hard mask layer 24A and the bit line conductive layer 23A may be etched using the bit line mask layer 25 as an etch barrier. As a result, the bit line 23 and a bit line hard mask 24 may be formed. The bit line 23 may be formed by etching the bit line conductive layer 23A. The bit line hard mask 24 may be formed by etching the bit line hard mask layer 24A.

Subsequently, the preliminary plug 22A may be etched to have the same line width as the bit line 23. As a result, the bit line contact plug 22 may be formed. The bit line contact plug 22 may be formed on the first impurity region 19. The bit line contact plug 22 may interconnect the first impurity region 19 and the bit line 23. The bit line contact plug 22 may be formed in the first contact hole 21. A line width of the bit line contact plug 22 may be smaller than a diameter of the first contact hole 21. Accordingly, gaps G may be defined on either side of the bit line contact plug 22.

As described above, as the bit line contact plug 22 is formed, the gaps G may be formed in the first contact hole 21. This is because the bit line contact plug 22 is etched to be smaller than the diameter of the first contact hole 21. The gaps G may be independently formed on both side walls of the bit line contact plug 22. The gaps G may not surround the bit line contact plug 22. As a result, a single bit line contact plug 22 and a pair of gaps G may be located in the first contact hole 21, with the gaps G being isolated from each other by the bit line contact plug 22. Bottom surfaces of the gaps G may extend inside the isolation layer 12. In other words, the bottom surfaces of the gaps G may be at a lower level than the recessed top surface of the first impurity region 19.

A structure where the bit line contact plug 22, the bit line 23 and the bit line hard mask 24 are sequentially stacked is also referred to herein as a bit line structure. When viewed from a top, the bit line structure may be a pattern structure having a line shape.

The bit line mask layer 25 may then be removed.

Figure 10:
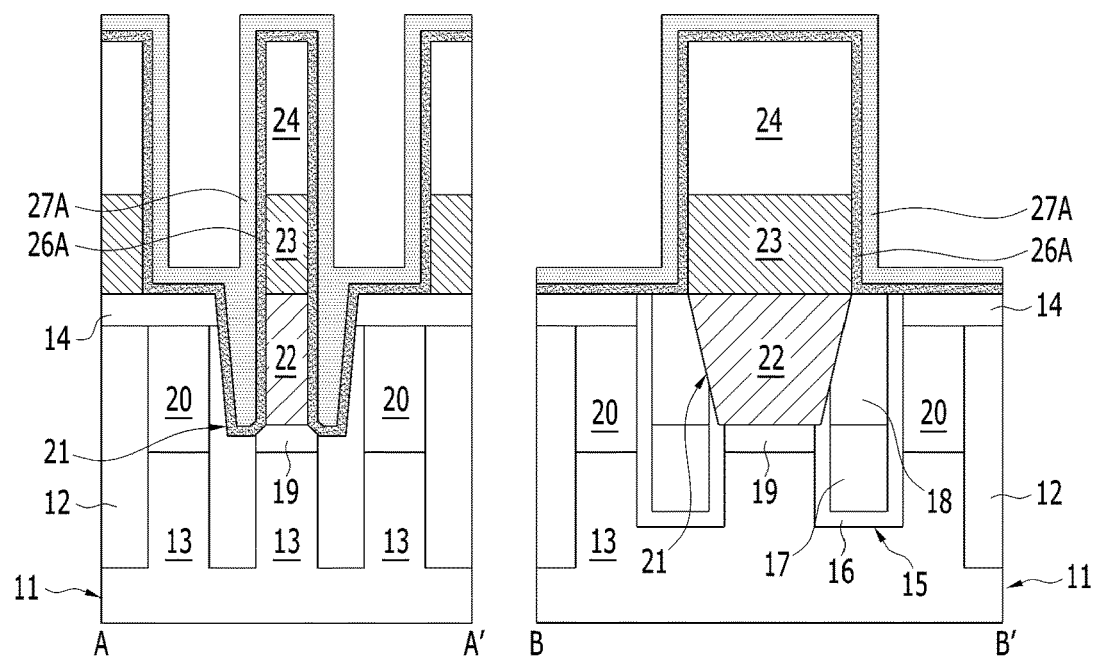

Referring to FIG. 10, a first spacer layer 26A may be formed. The first spacer layer 26A may conformally cover both side walls of the bit line contact plug 22 and both side walls of the bit line 23. The first spacer layer 26A may also cover a top surface and side walls of the bit line hard mask 24. The first spacer layer 26A may include a passivation material capable of suppressing oxidation of the bit line 23 during a subsequent process. The first spacer layer 26A may be formed to be sufficiently thin so as to suppress the oxidation of the bit line 23. More specifically, it is noted that when the first spacer layer 26A is too thick, it becomes more difficult to reduce the parasitic capacitance. Hence, the first spacer layer 26A may be formed to have an effective thickness for suppressing the oxidation of the bit line 23 and at the same time reduces parasitic capacitance to an acceptable level. It is further noted that the effective thickness may vary based on the material employed in forming the first spacer layer 26A. In an embodiment, the first spacer layer 26A may be approximately 1 nm.

The first spacer layer 26A may include a dielectric material. The first spacer layer 26A may include a silicon nitride. In an embodiment, the first spacer layer 26A may have a low-k of approximately 7.5. In an embodiment, the first spacer layer 26A may have a low-k of approximately 7.5 and an effective thickness of approximately 1 nm. The first spacer layer 26A is also referred to herein as a "first protective layer".

Subsequently, a second spacer layer 27A may be formed. The second spacer layer 27A may be formed on the first spacer layer 26A. The second spacer layer 27A may have a low-k equal to or lower than 5. The second spacer layer 27A is also referred to herein as an "initial low-k layer" or a "base low-k material layer". The initial low-k layer and the base low-k material layer may refer to a material prior to conversion.

The second spacer layer 27A may include a silicon-based material. The second spacer layer 27A may include one or more impurities, for example, selected from carbon, boron, or a combination thereof. A low-k of the second spacer layer 27A may be obtained by the impurities. The second spacer layer 27A may include an impurity-containing silicon-based material. The impurity-containing silicon-based material may include SiCO, SiCN, SiOCN, SiBN or SiBCN. In addition, an etch rate of the second spacer layer 27A may be smaller than an etch rate of the first spacer layer 26A due to the impurities. That is, the second spacer layer 27A may have an etch selectivity over the first spacer layer 26A.

A portion of the second spacer layer 27A may fill the gaps G. For example, the first spacer layer 26A may conformally line surfaces of the gaps G, and the portion of the second spacer layer 27A may fill the gaps G on the first spacer layer 26A. The second spacer layer 27A may be thicker than the first spacer layer 26A. The second spacer layer 27A may be thicker than 2 nm. In order to reduce the parasitic capacitance, the first spacer layer 26A may be formed to be maximally thin. The first spacer layer 26A may be a thin silicon nitride. The first spacer layer 26A may include an undoped silicon nitride, for example, a conventional silicon nitride ($Si_3N_4$).

The etch rate of the second spacer layer 27A may be smaller than the etch rate of the first spacer layer 26A. The second spacer layer 27A may include an impurity-containing silicon-based material, and the first spacer layer 26A may include a conventional silicon nitride. An etch rate of the impurity-containing silicon-based material may be smaller than an etch rate of the conventional silicon nitride.

Under a condition of the same dry etch process (or dry cleaning process) and wet etch process (or wet cleaning process), the etch rate of the second spacer layer 27A may be smaller than the etch rate of the conventional silicon nitride. For example, in the dry etch process of $NF_3/H_2O$, the etch rate of the second spacer layer 27A may be approximately 0.2 Å/250 sec, and the etch rate of the conventional silicon nitride may be approximately 14.6 Å/250 sec. In the wet etch process using a LAL solution, the etch rate of the second spacer layer 27A may approximately 0.4 Å/15 sec, and the etch rate of the conventional silicon nitride may be approximately 11.1 Å/15 sec. The LAL solution may include $H_2O$, HF and $NH_4F$. In this manner, the second spacer layer 27A may have an etch selectivity over the first spacer layer 26A. The impurity-containing silicon-based material, for example, SiCN, SiOCN, SiBN and SiBCN, as the second spacer layer 27A may contain an impurity such as carbon and boron. The conventional silicon nitride may be an undoped silicon nitride undoped with carbon or boron.

Figure 11:
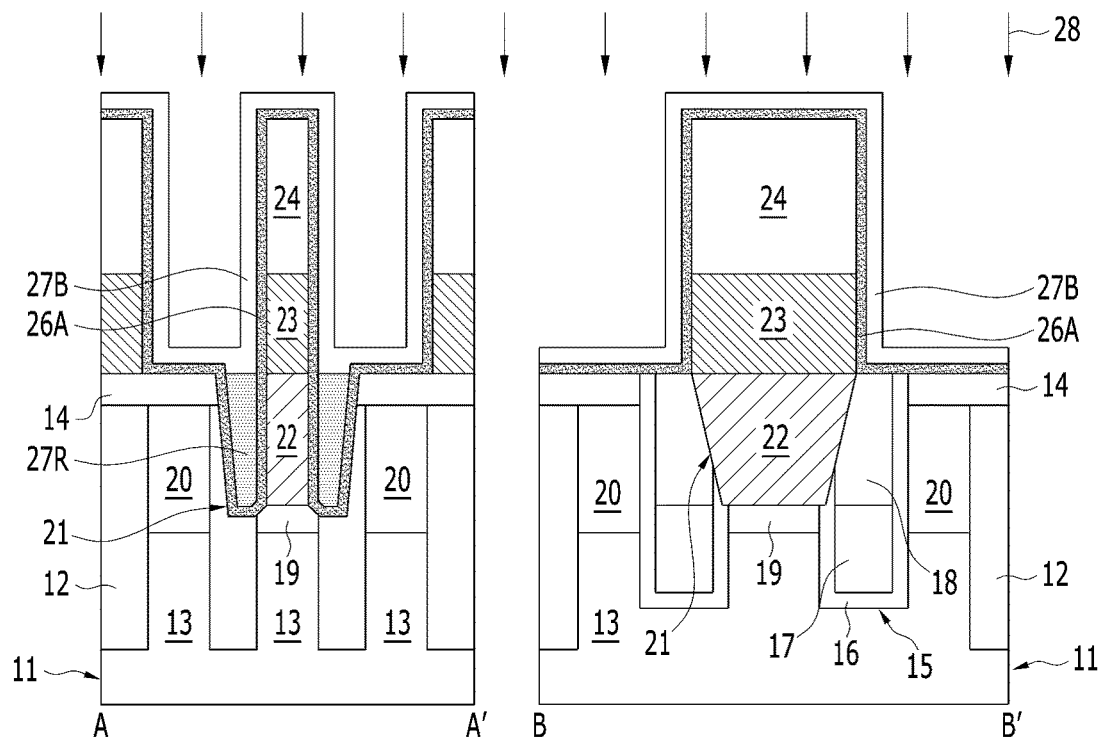

Referring to FIG. 11, the second spacer layer 27A may be exposed by a converting process 28.

The second spacer layer 27A may be partially converted by the converting process 28. For example, the second spacer layer 27A may include a converted portion 27B and a non-converted portion 27R. The converted portion 27B may be located on both side walls of the bit line 23. The non-converted portion 27R may be located on both side walls of the bit line contact plug 22. The non-converted portion 27R may be located in the gaps G. A top surface of the non-converted portion 27R may be at the same level as a top surface of the bit line contact plug 22.

The converting process 28 may convert a dielectric constant of the second spacer layer 27A into a lower dielectric constant. The converting process 28 may include an oxidation process. The converting process 28 may include a radical oxidation process. The second spacer layer 27A may be partially oxidized by the radical oxidation process. An oxidized portion may be the converted portion 27B, and remaining portion which is not oxidized may be the non-converted portion 27R.

The converted portion 27B and the non-converted portion 27R may have different dielectric constants. The non-converted portion 27R may maintain the low-k of the second spacer layer 27A. A dielectric constant of the converted portion 27B may be lower than the low-k of the second spacer layer 27A. The dielectric constant of the converted portion 27B may be lower than the non-converted portion 27R. The converted portion 27B may have a dielectric constant of approximately 3.9. Most of the second spacer layer 27A, that is, the second spacer layer 27A formed outside the gaps G may be fully converted into the converted portion 27B. The converted portion 27B may directly contact the first spacer layer 26A on the side walls of the bit line contact plug 22.

The non-converted portion 27R may be thicker than the converted portion 27B. The converted portion 27B may be thicker than the first spacer layer 26A.

The non-converted portion 27R may be the same material as the second spacer layer 27A. The non-converted portion 27R may include a doped material. The doped material may include one or more impurities selected from carbon, boron, or a combination thereof. The non-converted portion 27R may include SiCO, SiCN, SiOCN, SiBN, SiBCN or combinations thereof. The converted portion 27B may include a silicon oxide (hereinafter referred to as a "converted silicon oxide") converted from the doped material. The converted portion 27B may include the converted silicon oxide including impurities. The converted silicon oxide may include one or more impurities selected from carbon, boron, or a combination thereof. The converted portion 27B may include a silicon oxide converted from one or more doped materials selected from SiCO, SiCN, SiOCN, SiBN, SiBCN or combinations thereof.

Although an impurity such as carbon and boron may exist in the converted silicon oxide, a silicon oxide component rather than the doped material may be dominantly formed of the converted silicon oxide. As a result, a dielectric constant of the converted silicon oxide may be lower than a dielectric constant of the doped material. The converted silicon oxide may have a similar dielectric constant to the conventional silicon oxide. In some embodiments, the dielectric constant of the converted silicon oxide may be approximately 3.9.

Figure 12:
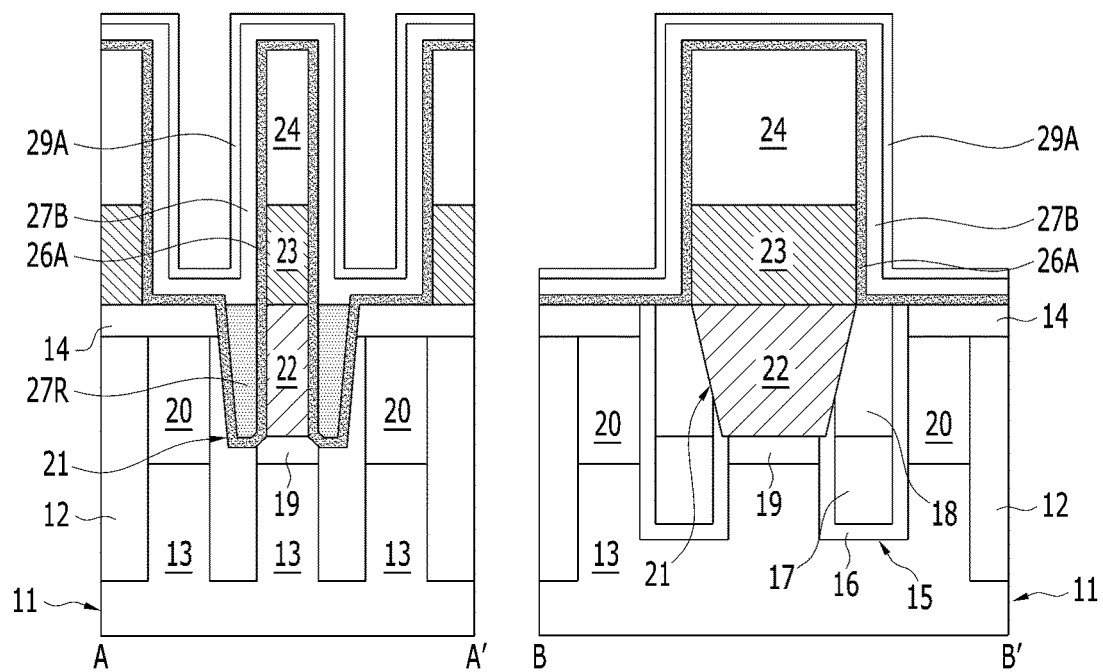

Referring to FIG. 12, a third spacer layer 29A may be formed on the converted portion 27B. The third spacer layer 29A may not contact the non-converted portion 27R. The third spacer layer 29A may be a dielectric material. The third spacer layer 29A may include a low-k layer. The third spacer layer 29A may have a higher dielectric constant than the converted portion 27B. The third spacer layer 29A may have the same dielectric constant as the first spacer layer 26A. The third spacer layer 29A and the first spacer layer 26A may be the same materials. The third spacer layer 29A may include an undoped silicon nitride. The third spacer layer 29A and the first spacer layer 26A may have the same thickness. The third spacer layer 29A may be thinner than the converted portion 27B. The third spacer layer 29A may not fill the gaps G. The third spacer layer 29A may serve as a protective layer to prevent the converted portion 27B and the non-converted portion 27R from being removed in a subsequent process. Since it is difficult to reduce the parasitic capacitance when the third spacer layer 29A is thick, the third spacer layer 29A may be maximally thin for serving as the protective layer. The third spacer layer 29A is also referred to herein as a "second protective layer". The third spacer layer 29A may be approximately 1 nm thick.

As described above, the first spacer layer 26A and the non-converted portion 27R may be formed on both side walls of the bit line contact plug 22. The first spacer layer 26A, the converted portion 27B and the third spacer layer 29A may be formed on both side walls of the bit line 23.

Figure 13:
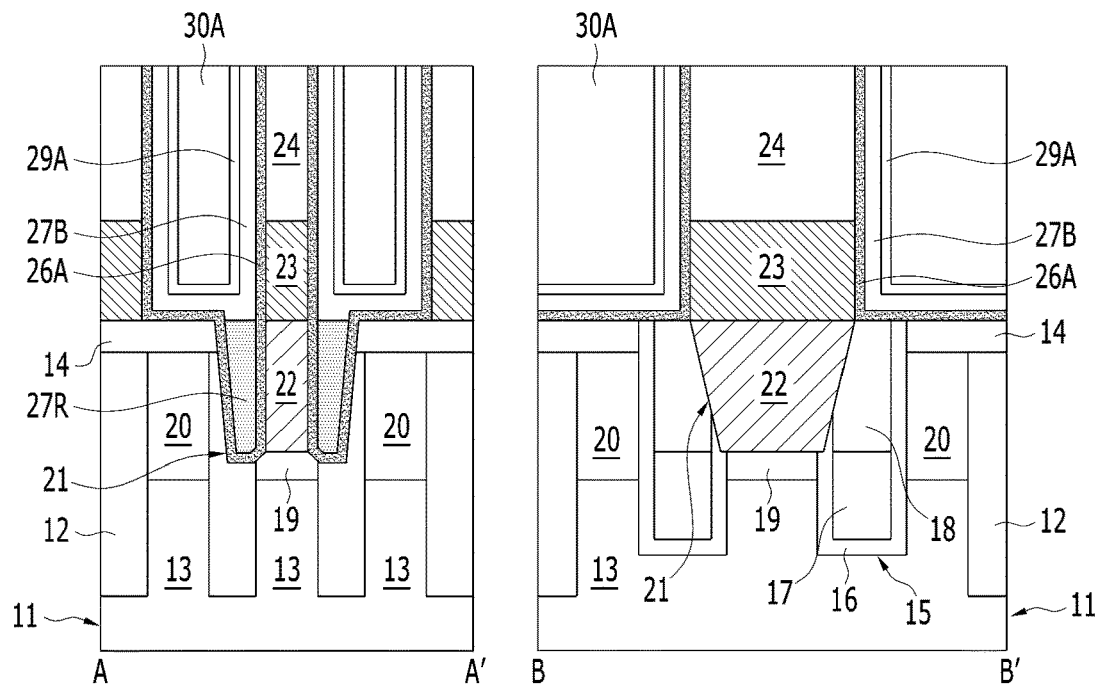

Referring to FIG. 13, a sacrificial layer 30A may be formed. The sacrificial layer 30A may fill a space between the bit line structures. The sacrificial layer 30A may be formed of a dielectric material. The sacrificial layer 30A may be formed of a silicon oxide. The sacrificial layer 30A may include a spin-on dielectric (SOD) material. Subsequently, the sacrificial layer 30A may be planarized to expose a top portion of the bit line hard mask 24. As a result, the sacrificial layer 30A having a line shape may be formed between the bit line structures. The sacrificial layer 30A may be extended parallel to the bit line structures. During a planarization process of the sacrificial layer 30A, the first spacer layer 26A, the converted portion 27B and the third spacer layer 29A may be planarized to expose the top surface of the bit line hard mask 24. In a plan view, the first spacer layer 26A, the converted portion 27B and the third spacer layer 29A may have a line shape extending parallel to the side walls of the bit line 23.

Figure 14:
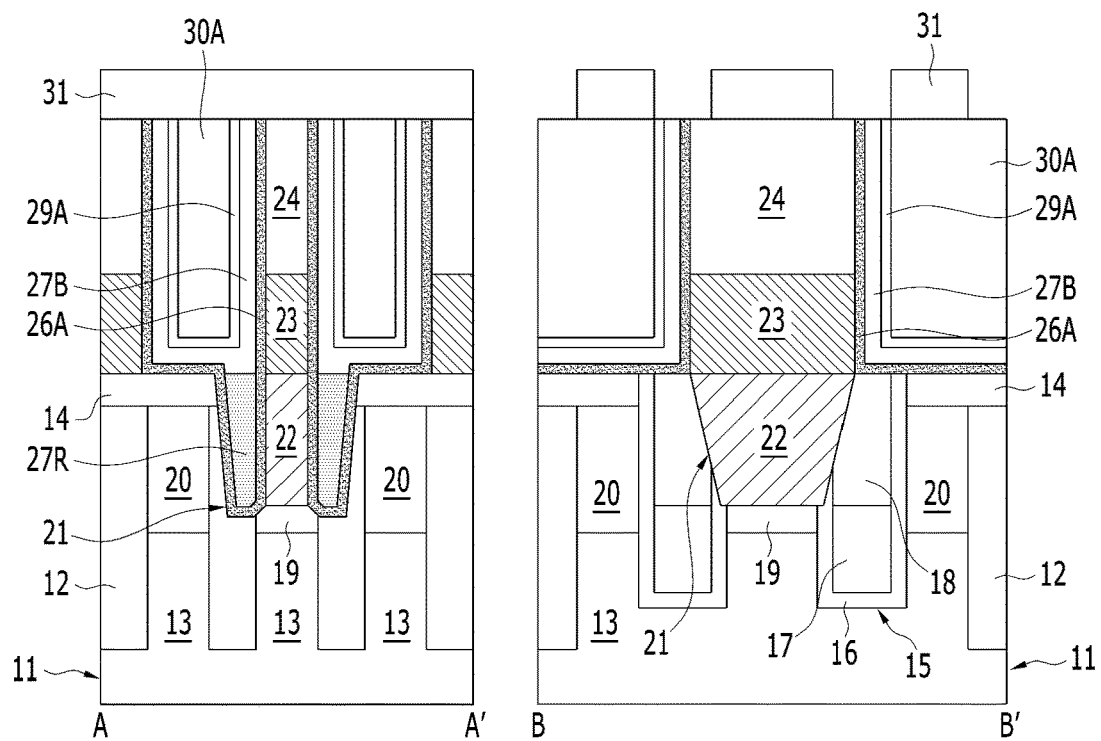

Referring to FIG. 14, a line-type mask pattern 31 may be formed on the bit line structure and the sacrificial layer 30A. The line-type mask pattern 31 may be patterned in a direction intersecting the bit line structure. The line-type mask pattern 31 may have a line shape. The line-type mask pattern 31 may include a photoresist pattern. The line-type mask pattern 31 may have a line/space shape. In a plan view, a space of the line-type mask pattern 31 may overlap the buried word line 17. A top surface of the sacrificial layer 30A may be partially exposed by the line-type mask pattern 31.

Figure 15:
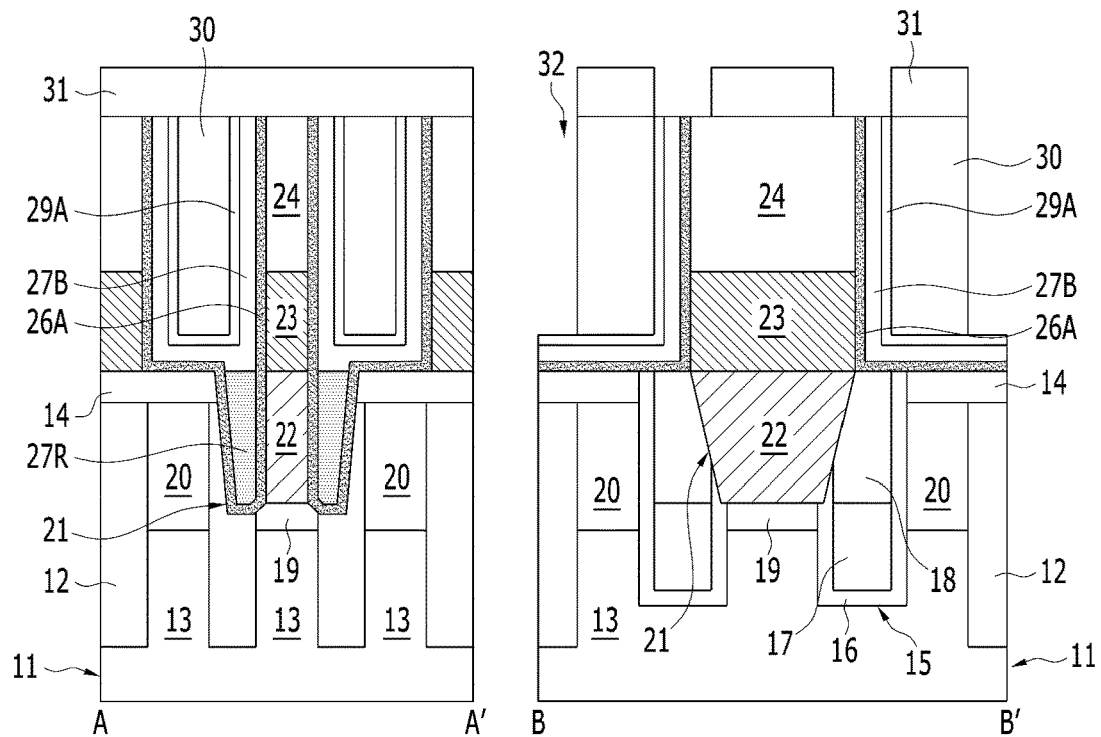

Referring to FIG. 15, a pre-isolation part 32 may be formed in the sacrificial layer 30A. The sacrificial layer 30A may be etched using the line-type mask pattern 31 as an etch mask. As a result, the pre-isolation part 32 may be formed, and a sacrificial pattern 30 may remain between neighboring pre-isolation parts 32.

The pre-isolation part 32 may overlap the buried word line 17. In some embodiments, the pre-isolation part 32 may have a smaller line width than the buried word line 17.

Figure 16:
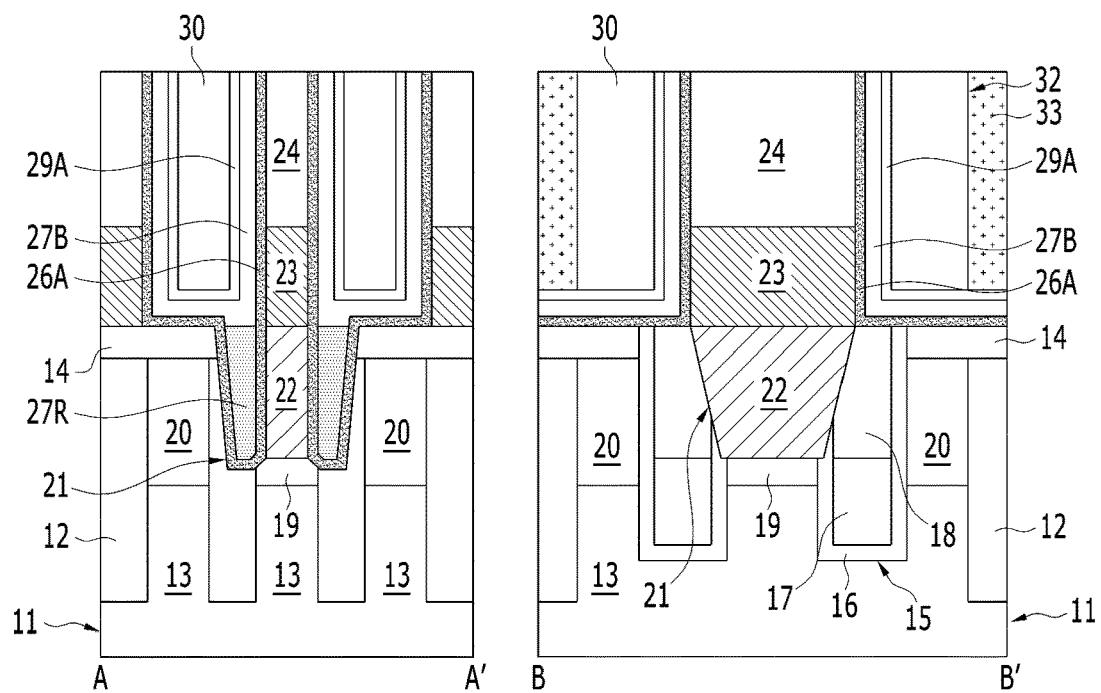

Referring to FIG. 16, the line-type mask pattern 31 may be removed. A plug isolation layer 33 may be formed in the pre-isolation part 32. After a silicon nitride is formed to gap-fill the pre-isolation part 32, the plug isolation layer 33 may be formed by a planarization process. The plug isolation layer 33 may be formed between the bit line structures in the direction intersecting the bit line structure. The sacrificial pattern 30 may be formed between the bit line structures in the direction intersecting the bit line structure. The plug isolation layer 33 and the sacrificial pattern 30 may be alternately located in a direction parallel to the bit line structure. The plug isolation layer 33 may fill the pre-isolation part 32.

The plug isolation layer 33 and the third spacer layer 29A may be the same material. In some embodiments, the plug isolation layer 33 and the third spacer layer 29A may be different materials. The plug isolation layer 33 and the third spacer layer 29A may have an etch selectivity over the sacrificial pattern 30.

Figure 17:
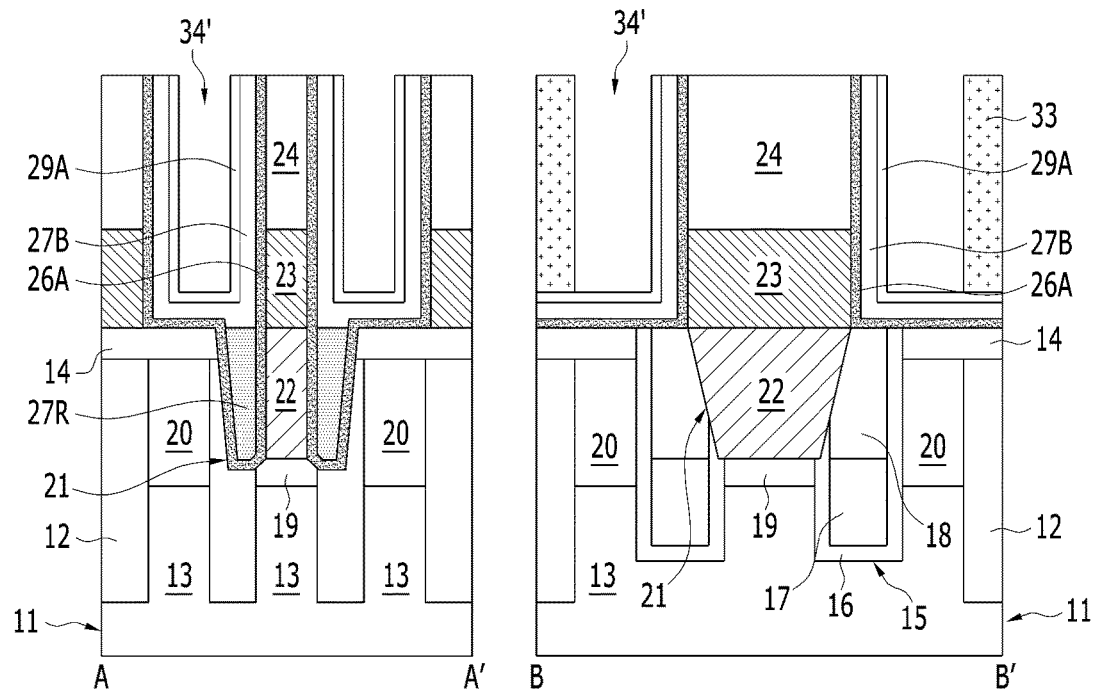

Referring to FIG. 17, the sacrificial pattern 30 may be removed. A space where the sacrificial pattern 30 is removed may become a preliminary second contact hole 34'. In the direction parallel to the bit line structure, the preliminary second contact hole 34' and the plug isolation layer 33 may be alternately formed. Neighboring preliminary second contact holes 34' may be arranged to have a shape isolated by the bit line structure and the plug isolation layer 33. In a plan view, the preliminary second contact hole 34' may have a rectangular hole shape.

In order to remove the sacrificial pattern 30, a dip-out process may be performed. Through the dip-out process, the sacrificial pattern 30 may be selectively removed without a loss of the first spacer layer 26A, the converted portion 27B and the third spacer layer 29A.

Figure 18:
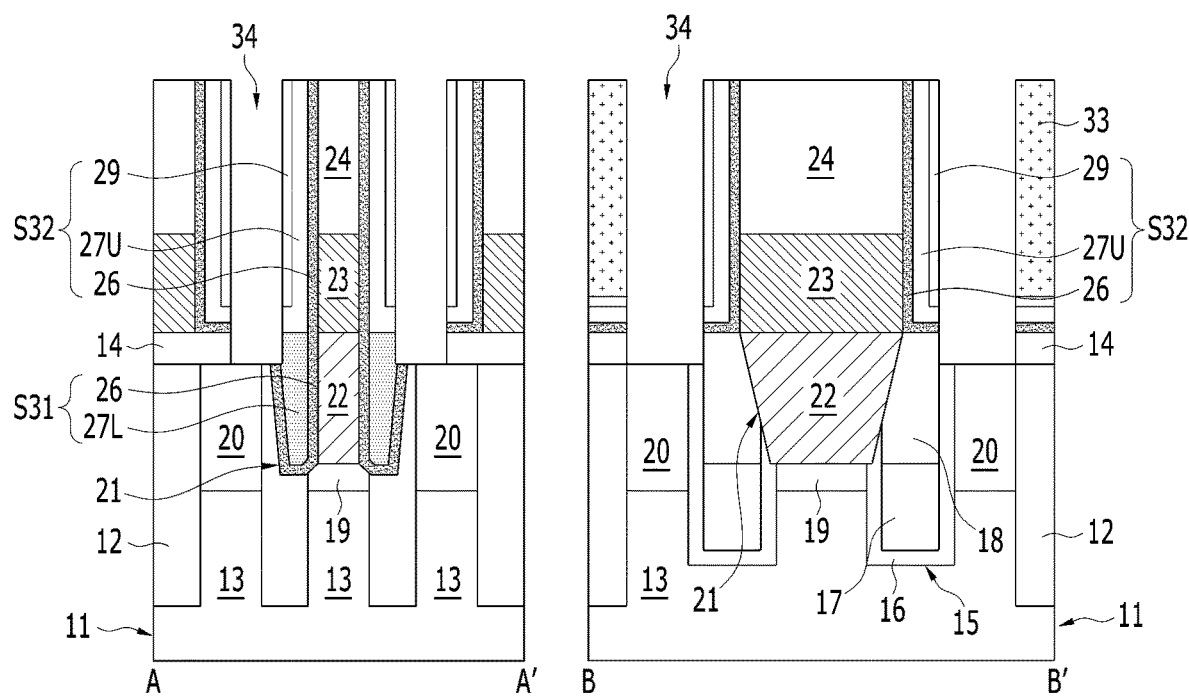

Referring to FIG. 18, bottom materials may be etched to be self-aligned in the preliminary second contact hole 34'. As a result, a second contact hole 34 may be formed. The second contact hole 34 may have a downwardly extending shape of the preliminary second contact hole 34'.

In order to form the second contact hole 34, the third spacer layer 29A, the converted portion 27B, the first spacer layer 26A and the hard mask layer 14 below the preliminary second contact hole 34' may be sequentially etched. The second contact hole 34 may expose a surface of the substrate 11.

A bottom of the second contact hole 34 may be extended into the substrate 11. While the second contact hole 34 is formed, the isolation layer 12, the gate capping layer 18 and the second impurity region 20 may be recessed with a predetermined depth. A bottom surface of the second contact hole 34 may be at a lower level than a top surface of the bit line contact plug 22. The bottom surface of the second contact hole 34 may be at a higher level than a bottom surface of the bit line contact plug 22. The second contact hole 34 is also referred to herein as a "storage node contact hole".

A plurality of spacers may be formed on both side walls of the bit line structure through an etch process for forming the second contact hole 34. The plurality of spacers may include materials having three or more different dielectric constants.

The plurality of spacers may include a first spacer 26, second spacers 27L and 27U, and a third spacer 29. The first spacer 26 may directly contact the side walls of the bit line structure. The second spacers 27L and 27U may cover the first spacer 26. The third spacer 29 may cover a top 27U of the second spacers 27L and 27U. A bottom 27L of the second spacers 27L and 27U may not be covered by the third spacer 29. The second spacers 27L and 27U may include a non-converting spacer 27L and a converting spacer 27U. The non-converting spacer 27L may be located on bottom side walls of the bit line structure, and the converting spacer 27U may be located on top side walls of the bit line structure. The non-converting spacer 27L may be located on the side walls of the bit line contact plug 22, and the converting spacer 27U may be located on the side walls of the bit line 23. The non-converting spacer 27L may be located in the gaps G on the side walls of the bit line contact plug 22. Accordingly, the non-converting spacer 27L may have a plug shape. The non-converting spacer 27L is also referred to herein as a "plugging spacer" or a "gap-fill spacer".

The first spacer 26, the converting spacer 27U and the third spacer 29 may be sequentially stacked on the side walls of the bit line 23. The first spacer 26 and the non-converting spacer 27L may be sequentially stacked on the side walls of the bit line contact plug 22. The first spacer 26 may be formed on the side walls of the bit line contact plug 22 and extended to the side walls of the bit line 23.

The third spacer 29 may be formed by etching the third spacer layer 29A. The second spacer layer 27A and the first spacer layer 26A may be sequentially etched by aligning to side walls of the third spacer 29. The converting spacer 27U may be formed by etching the converted portion 27B of the second spacer layer 27A. The non-converting spacer 27L may be formed by etching the non-converted portion 27R of the second spacer layer 27A. The first spacer 26 may be formed by etching the first spacer layer 26A.

Since an etch rate of the non-converted portion 27R is smaller than etch rates of the third spacer 29 and the first spacer 26, an etch loss of the non-converting spacer 27L may be suppressed.

A first spacer structure S31 including the first spacer 26 and the non-converting spacer 27L may be formed on the side walls of the bit line contact plug 22. A second spacer structure S32 including the first spacer 26, the converting spacer 27U and the third spacer 29 may be formed on the side walls of the bit line 23. The first spacer structure S31 may be a double spacer structure. The second spacer structure S32 may be a triple spacer structure. The first spacer structure S31 may be a nitride low-k (NL) structure, and the second spacer structure S32 may be a nitride-oxide-nitride (NON) structure. The non-converting spacer 27L may occupy a maximum volume in the first spacer structure S31. The converting spacer 27U may occupy a maximum volume in the second spacer structure S32.

As described above, since the non-converting spacer 27L occupies the maximum volume, and the first spacer 26 and the third spacer 29 are formed thin when the first spacer structure S31 is formed, parasitic capacitance may be greatly reduced. Since the converting spacer 27U occupies the maximum volumes, and the first spacer 26 is formed thin when the second spacer structure S32 is formed, the parasitic capacitance may be greatly reduced. Since a loss of the converting spacer 27U is suppressed, structural stability of the second spacer structure S32 may increase.

Figure 19:
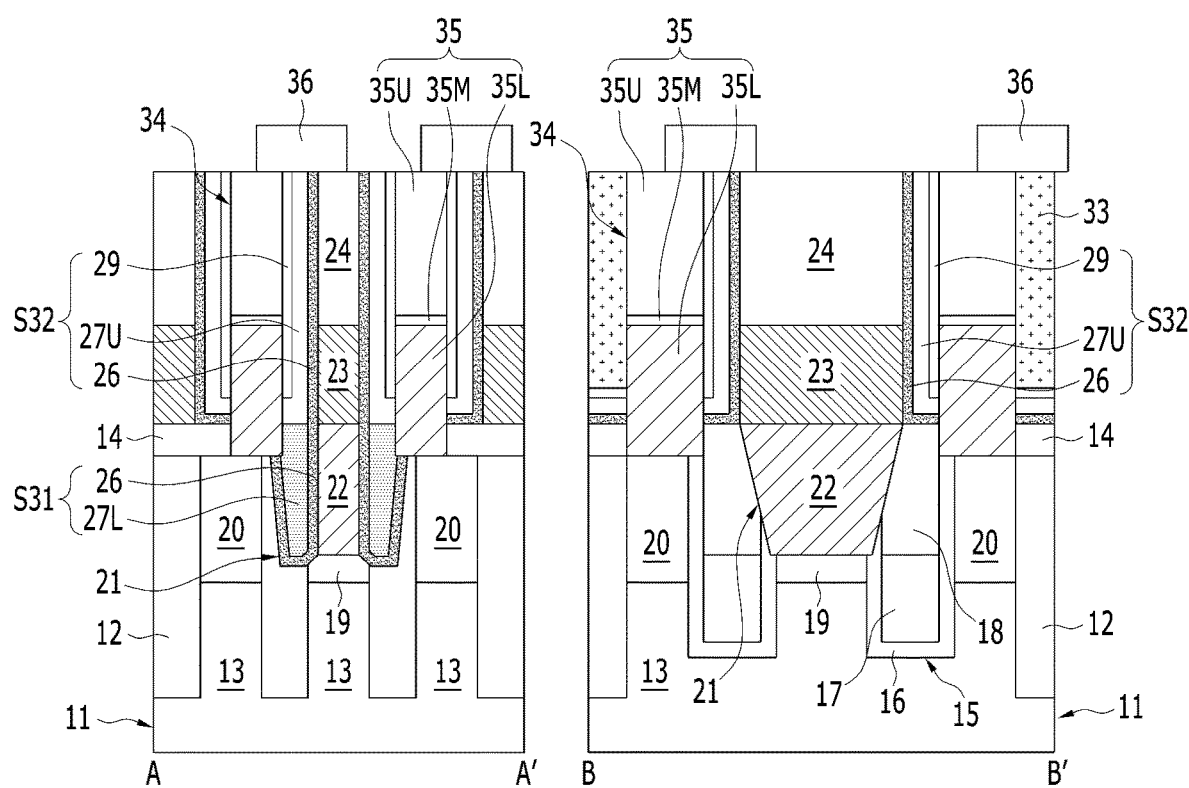

Referring to FIG. 19, a storage node contact plug 35 may be formed. The storage node contact plug 35 may fill the second contact hole 34. The storage node contact plug 35 may directly contact the second impurity region 20. The storage node contact plug 35 may be adjacent to the bit line structure. When viewed from a top, a plurality of storage node contact plugs 35 may be located between a plurality of bit line structures. In a direction parallel to the bit line 23, the plurality of storage node contact plugs 35 and a plurality of plug isolation layers 33 may be alternately located (refer to FIG. 3).

A bottom plug 35L, an ohmic contact layer 35M and a top plug 35U may be sequentially stacked in the storage node contact plug 35.

The bottom plug 35L may include a silicon-containing material. The bottom plug 35L may include polysilicon. The polysilicon may be doped with an impurity. The bottom plug 35L may be coupled to the second impurity region 20. A top surface of the bottom plug 35L may be higher than a top surface of the bit line 23. In order to form the bottom plug 35L, the polysilicon may be deposited to fill the second contact hole 34, and then the planarization process and the etch-back process may be sequentially performed.

The second spacer structure S32 may be located between the bit line 23 and the bottom plug 35L. The first spacer structure S31 may be located between the bit line contact plug 22 and the bottom plug 35L. Since the first spacer 26 and the third spacer 29 include a silicon nitride, and the converting spacer 27U includes a silicon oxide, an NON spacer may be located between the bit line 23 and the bottom plug 35L. Since the first spacer 26 includes a silicon nitride, and the non-converting spacer 27L includes a low-k material, an NL spacer may be located between the bit line contact plug 22 and the bottom plug 35L.

The ohmic contact layer 35M may be formed on the bottom plug 35L. The ohmic contact layer 35M may include a metal silicide. In order to form the ohmic contact layer 35M, a deposition process and an annealing process of a silicidable metal layer may be performed. Accordingly, silicidation may occur at an interface between the silicidable metal layer and the bottom plug 35L, whereby a metal silicide layer may be formed. The ohmic contact layer 35M may include a cobalt silicide. In an embodiment, the ohmic contact layer 35M may include a $CoSi_2$-phase cobalt silicide.

When the $CoSi_2$-phase cobalt silicide is formed as the ohmic contact layer 35M, a cobalt silicide having low resistance may be formed simultaneously while contact resistance is improved.

The top plug 35U may be formed on the ohmic contact layer 35M. In order to form the top plug 35U, a gap-fill process and a planarization process of a metal material (not illustrated) may be performed. The top plug 35U may be formed to fill the second contact hole 34 on the ohmic contact layer 35M. The top plug 35U may include a metal-containing layer. The top plug 35U may include a tungsten-containing material. The top plug 35U may include a tungsten layer or a tungsten compound.

Since the bottom plug 35L includes polysilicon, and the ohmic contact layer 35M and the top plug 35U include a metal material, the storage node contact plug 35 is also referred to herein as a "hybrid plug" or a "semi-metal plug".

Subsequently, although not illustrated, a memory element 36 may be formed on the top plug 35U.

According to the aforementioned embodiments, as the first spacer structure S31 including the non-converting spacer 27L is formed, parasitic capacitance between the bit line contact plug 22 and the storage node contact plug 35 may be reduced. In addition, since the non-converting spacer 27L occupies the maximum volume in the first spacer structure S31, the parasitic capacitance may be further reduced. For example, since the first spacer 26 having a high dielectric constant is made thin, and the non-converting spacer 27L having a lower dielectric constant is made thick, the parasitic capacitance may be further reduced. As a comparative example, the parasitic capacitance may be higher when the first spacer structure S31 is a nitride only structure which is comprised of only a silicon nitride than when the first spacer structure S31 is the NL structure. As another comparative example, structural stability may deteriorate more greatly when the first spacer structure S31 is a nitride-oxide (NO) structure which is comprised of a silicon nitride and a silicon oxide than when the first spacer structure S31 is the NL structure. For example, the silicon oxide may be lost in the NO structure during a subsequent process.

As the second spacer structure S32 including the converting spacer 27U is formed, parasitic capacitance between the bit line 23 and the storage node contact plug 35 may be reduced. In addition, since the first spacer 26 is thin simultaneously while the converting spacer 27U occupies the maximum volume in the second spacer structure S32, the parasitic capacitance may be further reduced.

In this manner, as the parasitic capacitance is reduced, a sensing margin of a memory cell may be improved.

According to embodiments of the present invention, a dielectric constant of a low-k material may be reduced, whereby parasitic capacitance between neighboring pattern structures may decrease.

According to embodiments of the present invention, an oxide having a low-k material may be formed between a bit line and a storage node contact plug, whereby parasitic capacitance may decrease.

According to embodiments of the present invention, a low-k material may be formed between a bit line contact plug and a storage node contact plug, whereby parasitic capacitance may decrease.

According to embodiments of the present invention, a low-k spacer having an etch tolerance may be formed between a bit line contact plug and a storage node contact plug, whereby structural stability of a spacer structure may increase.

While the present invention has been described with respect to specific embodiments, it should be noted that the embodiments are for describing, not limiting, the present invention. Further, it should be noted that the present invention may be achieved in various ways through substitution, change, and modification, by those skilled in the art without departing from the scope of the present invention as defined by the following claims.

What is claimed is:

1. A semiconductor device, comprising:
a conductive structure including a first contact plug and a conductive line on the first contact plug;
a second contact plug;
a first multi-layer spacer including a low-k spacer located between the first contact plug and the second contact plug; and
a second multi-layer spacer including a converting spacer located between the conductive line and the second contact plug,
wherein the converting spacer extended vertically from the low-k spacer to be located between the conductive line and the second contact plug,
wherein the converting spacer includes an oxide converted from the low-k spacer, and
wherein the low-k spacer occupies a maximum volume in the first multi-layer spacer, and the converting spacer occupies a maximum volume in the second multi-layer spacer.

2. The semiconductor device of claim 1, wherein the low-k spacer includes a low-k material.

3. The semiconductor device of claim 1, wherein the low-k spacer includes a low-k material, and the converting spacer includes a silicon oxide oxidized from the low-k material.

4. The semiconductor device of claim 1, wherein the low-k spacer includes a silicon-based material including carbon, boron, or a combination thereof, and the converting spacer includes a silicon oxide oxidized from the silicon-based material.

5. The semiconductor device of claim 1, wherein the low-k spacer includes at least one silicon-based material selected from SiCO, SiCN, SiOCN, SiBN and SiBCN, and the converting spacer includes a silicon oxide oxidized from the silicon-based material.

6. The semiconductor device of claim 1, wherein the converting spacer has a line shape formed parallel to both side walls of the conductive line.

7. The semiconductor device of claim 1, wherein the low-k spacer has a plug shape located on both side walls of the first contact plug.

8. The semiconductor device of claim 1, wherein the first contact plug includes a bit line contact plug, the conductive line includes a bit line, and the second contact plug includes a storage node contact plug.

9. The semiconductor device of claim 1, further comprising:
a semiconductor substrate including a first impurity region coupled to the first contact plug and a second impurity region coupled to the second contact plug; and
a dielectric material formed on the semiconductor substrate and including a first contact hole exposing the first impurity region,
wherein the first contact hole is filled with the first contact plug and the low-k spacer.

10. The semiconductor device of claim 9, further comprising:
a gate trench between the first impurity region and the second impurity region;
a buried word line formed in the gate trench; and
a memory element formed on the second contact plug.

11. A semiconductor device comprising:
a conductive structure including a first contact plug and a conductive line on the first contact plug;
a second contact plug;
a low-k spacer located between the first contact plug and the second contact plug;
a converting spacer extended vertically from the low-k spacer to be located between the conductive line and the second contact plug, wherein the converting spacer includes an oxide converted from the low-k spacer;
a first silicon nitride spacer located between the converting spacer and the conductive line; and
a second silicon nitride spacer located between the converting spacer and the second contact plug,
wherein the first silicon nitride spacer is extended between the low-k spacer and the second contact plug.

12. The semiconductor device of claim 11, wherein the first silicon nitride spacer and the second silicon nitride spacer are thinner than the low-k spacer and the converting spacer.

13. The semiconductor device of claim 11, wherein the low-k spacer has an etch selectivity over the first and second silicon nitride spacers.

14. The semiconductor device of claim 11, wherein the low-k spacer includes a silicon-based material containing an impurity including carbon, boron, or a combination thereof, and the first and second silicon nitride spacers include a silicon nitride containing no impurity.

* * * * *